US012678833B2

(12) United States Patent
Deguchi

(10) Patent No.: US 12,678,833 B2
(45) Date of Patent: Jul. 14, 2026

(54) SUBSTRATE PROCESSING MODULE AND SUBSTRATE PROCESSING DEVICE PROVIDED WITH SAME

(71) Applicant: DAIKIN FINETECH, LTD., Yamatokoriyama (JP)

(72) Inventor: Yasunori Deguchi, Yamatokoriyama (JP)

(73) Assignee: DAIKIN FINETECH, LTD., Yamatokoriyama (JP)

( * ) Notice: Subject to any disclaimer, the term of this patent is extended or adjusted under 35 U.S.C. 154(b) by 93 days.

(21) Appl. No.: 18/693,077

(22) PCT Filed: Dec. 27, 2021

(86) PCT No.: PCT/JP2021/048658

§ 371 (c)(1),
(2) Date: Mar. 18, 2024

(87) PCT Pub. No.: WO2023/127051

PCT Pub. Date: Jul. 6, 2023

(65) Prior Publication Data

US 2024/0387220 A1 Nov. 21, 2024

(51) Int. Cl.
*B08B 3/08* (2006.01)
*B08B 13/00* (2006.01)
(Continued)

(52) U.S. Cl.
CPC .............. *B08B 3/08* (2013.01); *B08B 13/00* (2013.01); *H10P 72/0411* (2026.01);
(Continued)

(58) Field of Classification Search
CPC ..... B08B 3/08; B08B 13/00; H01L 21/67766; H01L 21/6704; H01L 21/67057;
(Continued)

(56) References Cited

U.S. PATENT DOCUMENTS 5,853,496 A * 12/1998 Honda .............. H01L 21/67057
134/76
5,997,656 A * 12/1999 Kim .................. H01L 21/67276
134/25.4
(Continued)

FOREIGN PATENT DOCUMENTS

JP    H06-252072 A    9/1994
JP    H10-034062 A    2/1998
(Continued)

OTHER PUBLICATIONS

Machine translation of JP-2000306880-A to Kamikawa. (Year: 2000).*

(Continued)

*Primary Examiner* — Joseph L. Perrin
(74) *Attorney, Agent, or Firm* — HSML P.C.

(57) ABSTRACT

A substrate processing module of a substrate processing device includes a first tank and a second tank that are arranged in a first direction and in which a substrate can be disposed, first transport units and that move the substrate into the second tank and the first tank, and a second transport unit that transports the substrates in a second direction intersecting the first direction and transfers the substrates to and from the first transport units. The second transport unit includes a chuck that holds the substrate and passes above the first tank, and an actuator that moves the chuck in the second direction. The actuator of the second transport unit is disposed on a side of the first tank in the first direction in the substrate processing module.

11 Claims, 21 Drawing Sheets

(51) Int. Cl.
    *H10P 72/00*     (2026.01)
    *H10P 72/30*     (2026.01)

(52) U.S. Cl.
    CPC ...... *H10P 72/0416* (2026.01); *H10P 72/0422*
      (2026.01); *H10P 72/0426* (2026.01); *H10P*
      *72/30* (2026.01); *H10P 72/3202* (2026.01);
      *H10P 72/3206* (2026.01); *H10P 72/3312*
      (2026.01); *H10P 72/3402* (2026.01)

(58) Field of Classification Search
    CPC ......... H01L 21/67075; H01L 21/67086; H01L
      21/677; H01L 21/67706; H01L 21/67712;
      H01L 21/67757
    See application file for complete search history.

(56)         References Cited

U.S. PATENT DOCUMENTS 6,345,947 B1 *   2/2002   Egashira  .......... H01L 21/67781
                                 414/404

6,435,199 B1     8/2002   Kamikawa
2006/0021639 A1   2/2006   Masuda et al.
2018/0090341 A1 *   3/2018   Yamaguchi ....... H01L 21/67023

FOREIGN PATENT DOCUMENTS

| | | | |
|---|---|---|---|
| JP | 2000-301082 | A | 10/2000 |
| JP | 2000306880 | A * | 11/2000 |
| JP | 2018-056158 | A | 4/2018 |
| JP | 2021-072439 | A | 5/2021 |

OTHER PUBLICATIONS

International Preliminary Report on Patentability, International Patent Application No. PCT/JP2021/048658, mailed Jul. 11, 2024 (7 pages).

International Search Report of PCT/JP2021/048658, Mar. 22, 2022, 2 pages.

Extended European Search Report, European Patent Application No. 21969935.2, Jul. 30, 2025 (8 pages).

* cited by examiner

SUBSTRATE PROCESSING MODULE AND SUBSTRATE PROCESSING DEVICE PROVIDED WITH SAME

TECHNICAL FIELD

The present disclosure relates to a substrate processing module for processing a substrate and a substrate processing device including the same.

BACKGROUND ART

Patent Document 1 discloses a substrate processing device in which a plurality of pairs of a chemical liquid tank and a cleaning tank are disposed in a longitudinal direction of the device, and a main transport mechanism and a sub-transport mechanism are included. The main transport mechanism moves a plurality of substrates in the longitudinal direction from one end side to the other end side of the device. The sub-transport mechanism moves the plurality of substrates in the longitudinal direction and the vertical direction within a range of the pair of chemical liquid tank and the cleaning tank.

PRIOR ART DOCUMENT

Patent Document

Patent Document 1: JP-A-2018-56158

SUMMARY OF THE DISCLOSURE

Problems to be Solved by the Disclosure

In the case of the substrate processing device described in Patent Document 1, a plurality of processing tanks such as a chemical liquid tank and a cleaning tank are lined up in a main transport direction of the substrates of the main transport mechanism. Therefore, as the number of processing tanks increases, a size of the substrate processing device in the main transport direction of the substrates increases.

Therefore, an object of the present disclosure is to suppress an increase in size of a substrate processing device due to an increase in the number of processing tanks.

Solutions to the Problems

In order to solve the above problem, according to one aspect of the present disclosure, provided is a substrate processing module that processes a substrate, the substrate processing module including:

a first tank and a second tank that are arranged in a first direction and in which a substrate can be disposed;

a first transport unit that transports the substrate to the first tank and the second tank; and a second transport unit that transports the substrate in a second direction intersecting the first direction and transfers the substrate to and from the first transport unit, in which the second transport unit includes a chuck that holds the substrate and passes above the first tank, and an actuator that moves the chuck in the second direction, and the actuator of the second transport unit is disposed on a side of the first tank in the first direction in the substrate processing module.

According to another aspect of the present disclosure, provided is a substrate processing device including: the substrate processing module; and another module connected to the substrate processing module in the second direction.

Effects of the Disclosure

According to the present disclosure, it is possible to suppress an increase in size of the substrate processing device due to an increase in the number of processing tanks.

DETAILED DESCRIPTION

A substrate processing module according to one aspect of the present disclosure is a substrate processing module that processes a substrate, the substrate processing module including: a first tank and a second tank that are arranged in a first direction and in which a substrate can be disposed; a first transport unit that transports the substrate to the first tank and the second tank; and a second transport unit that transports the substrate in a second direction intersecting the first direction and transfers the substrate to and from the first transport unit, in which the second transport unit includes a chuck that holds the substrate and passes above the first tank, and an actuator that moves the chuck in the second direction, and the actuator of the second transport unit is disposed on a side of the first tank in the first direction in the substrate processing module.

According to such an aspect, it is possible to suppress an increase in size of a substrate processing device due to an increase in the number of processing tanks.

For example, the actuator of the second transport unit may be disposed above or below the first tank.

For example, the actuator of the second transport unit may be disposed above the first tank.

For example, the actuator of the second transport unit may be disposed in a drive space isolated from a treatment space in which the first tank and the second tank are disposed.

A top plate portion may be provided above the treatment space, and the drive space may be located above the top plate portion.

For example, the second transport unit may include an arm extending in a height direction so as to connect the actuator and the chuck, and the arm is preferably located in front of the first tank.

For example, the substrate processing module may include a hanging plate that partitions an upper space of the first tank and the arm.

For example, the first transport unit may include two first transport units. In this case, one of the first transport units includes a first chuck movable into the first tank in a state of holding the substrate, the other of the first transport units includes a second chuck movable into the second tank and movable above the first tank in a state of holding the substrate, and the first chuck and the second chuck are configured to be able to transfer the substrate between the first chuck and the second chuck.

A substrate processing device according to another aspect of the present disclosure includes the substrate processing module and another module connected to the substrate processing module in the second direction.

According to such an aspect, it is possible to suppress an increase in size of a substrate processing device due to an increase in the number of processing tanks.

Hereinafter, embodiments of the present disclosure will be described with reference to the drawings.

First Embodiment

Figure 1:
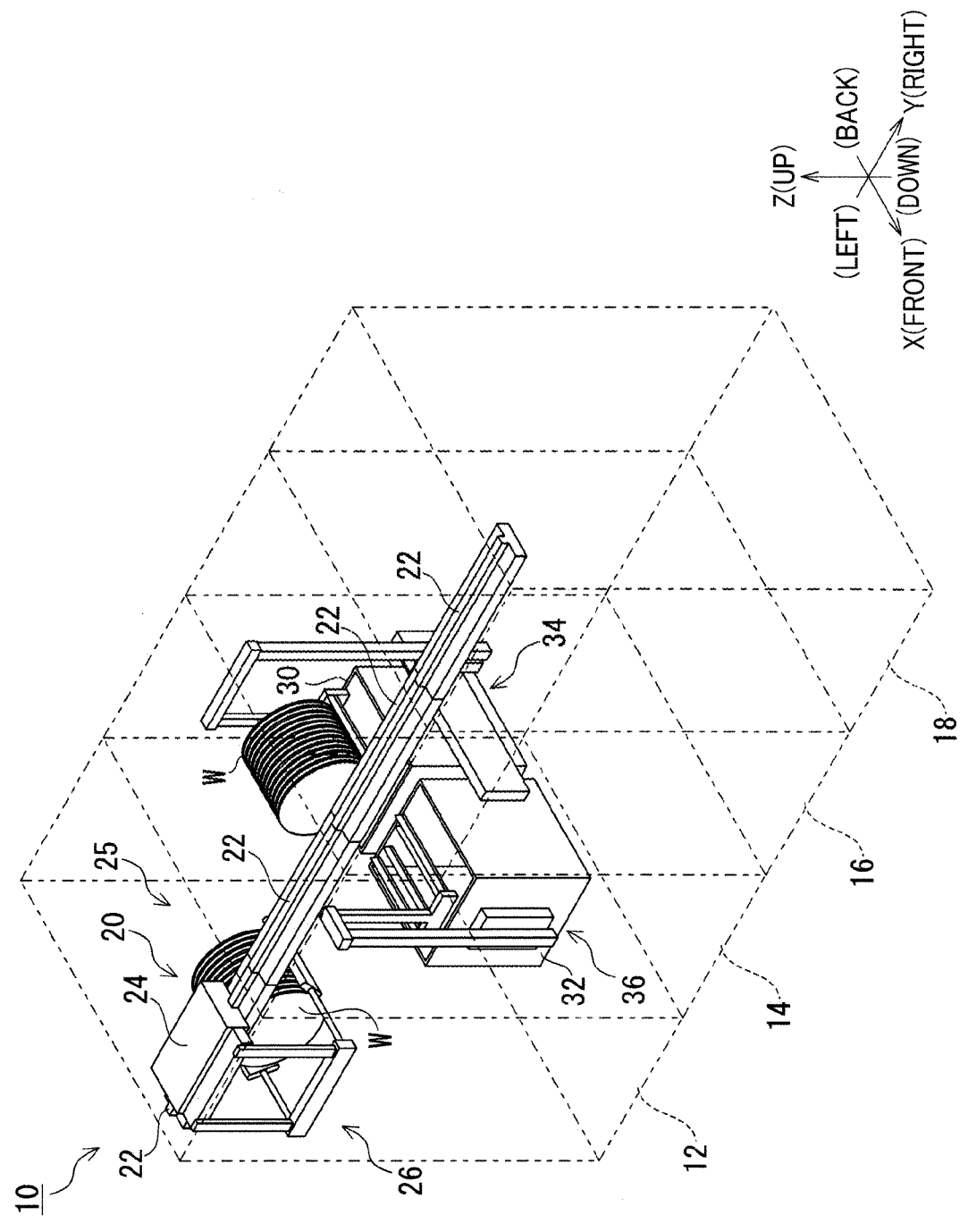
FIG. 1 is a perspective view of a substrate processing device according to a first embodiment of the present disclosure.

FIG. 1 is a perspective view of a substrate processing device according to a first embodiment of the present disclosure. Note that the X-Y-Z orthogonal coordinate system illustrated in the drawings is for facilitating understanding of the disclosure, and does not limit the disclosure. The X-axis direction is a front-back direction (first direction) of the substrate processing device, the Y-axis direction is a left-right direction (second direction), and the Z-axis direction is a height direction (third direction).

As illustrated in FIG. 1, a substrate processing device 10 according to the present first embodiment is a device for processing a substrate W, and is configured by connecting a plurality of modules having different functions in the Y-axis direction (second direction). The substrate W is a circular thin plate, and is, for example, a semiconductor substrate, a glass substrate for a liquid crystal display device, a glass substrate for a photomask, a substrate for an optical disk, a MEMS sensor substrate, a panel for a solar cell, or the like.

In the case of the present first embodiment, the substrate processing device 10 includes a loading module 12, a chemical module (substrate processing module) 14, a drying module 16, and an unloading module 18. The modules 12, 14, 16, and 18 are connected in the Y-axis direction (second direction). The substrate W is loaded from the outside into the loading module 12, and the chemical module 14 performs chemical liquid treatment on the substrate W loaded into the loading module 12. In the drying module 16, the substrate W that has been treated in the chemical module 14 is subject to a drying process. The substrate W dried by the drying module 16 is unloaded from the unloading module 18 to the outside. Note that the configuration of the modules may be changed according to the type of the substrate W and the processing contents. For example, the substrate processing device 10 may include a plurality of the chemical modules 14 that perform different treatments on the substrate W.

Furthermore, the substrate processing device 10 includes a second transport unit 20 that transports the substrate W in the Y-axis direction (second direction) between the plurality of modules. The second transport unit 20 includes an actuator 25 and a chuck 26 moved in the Y-axis direction by the actuator 25. The actuator 25 includes, for example, a rail 22 provided and connected to each of the plurality of modules 12 to 18 and a moving head 24 (moving body) that moves according to the rail 22. The chuck 26 is supported by the moving head 24 to hold the substrate W. When the moving head 24 moves in the Y-axis direction in which the plurality of modules 12 to 18 are lined up along the rail 22, the chuck 26 moves so as to pass through each of the plurality of modules 12 to 18. Note that details of the second transport unit 20 will be described later. As a result, a plurality of the substrates W are transported in the second direction.

Figure 2:
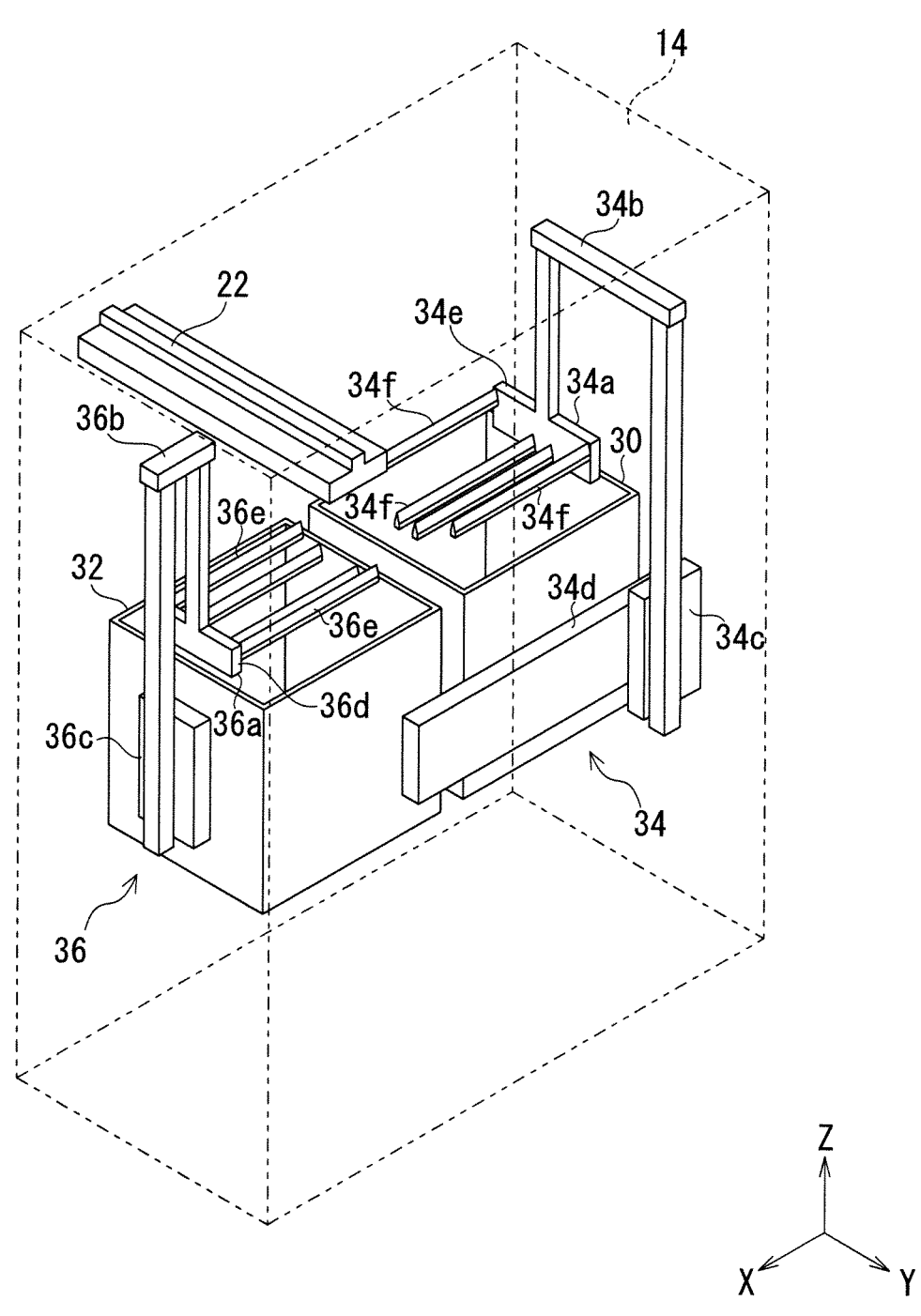
FIG. 2 is a perspective view of a chemical module in the substrate processing device.

FIG. 2 is a schematic perspective view of the chemical module in the substrate processing device.

In the chemical module 14 illustrated in FIG. 2, as the treatment for the substrate W, for example, various chemical liquid treatments such as ammonium hydroxide-hydrogen peroxide mixture (APM) cleaning, sulfuric acid-hydrogen peroxide mixture (SPM) cleaning, hydrochloric acid-hydrogen peroxide mixture (HPM) cleaning, and diluted hydrofluoric acid (DHF) cleaning, and various chemical liquid treatments such as etching and resist peeling are performed. These chemical liquid treatments can be arbitrarily combined depending on the type of chemical liquid treatment for the substrate W.

The chemical module 14 of the substrate processing device 10 includes a first tank 32 and a second tank 30 which are arranged in the X-axis direction (first direction) and in which the substrate W can be disposed as processing tanks for processing the substrate W. The second tank 30 is located on a rear side of the substrate processing device 10, and the first tank 32 is located on a front side of the substrate processing device 10. Note that, in the case of the present first embodiment, the second tank 30 is a chemical liquid tank that stores a chemical liquid in which the substrate W is immersed, and the first tank 32 is a cleaning tank that stores a cleaning liquid such as pure water in which the substrate W treated with the chemical liquid is immersed.

Furthermore, the chemical module 14 of the substrate processing device 10 includes a plurality of first transport units 34 and 36 that raise and lower the substrate W in the Z-axis direction (third direction).

Figure 3A:
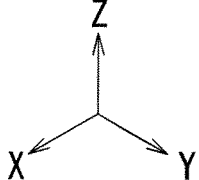
FIG. 3A is a perspective view illustrating a state in which a first chuck of one first transport unit and a second chuck of the other first transport unit are located above the first tank and the second tank, respectively.
Figure 3B:
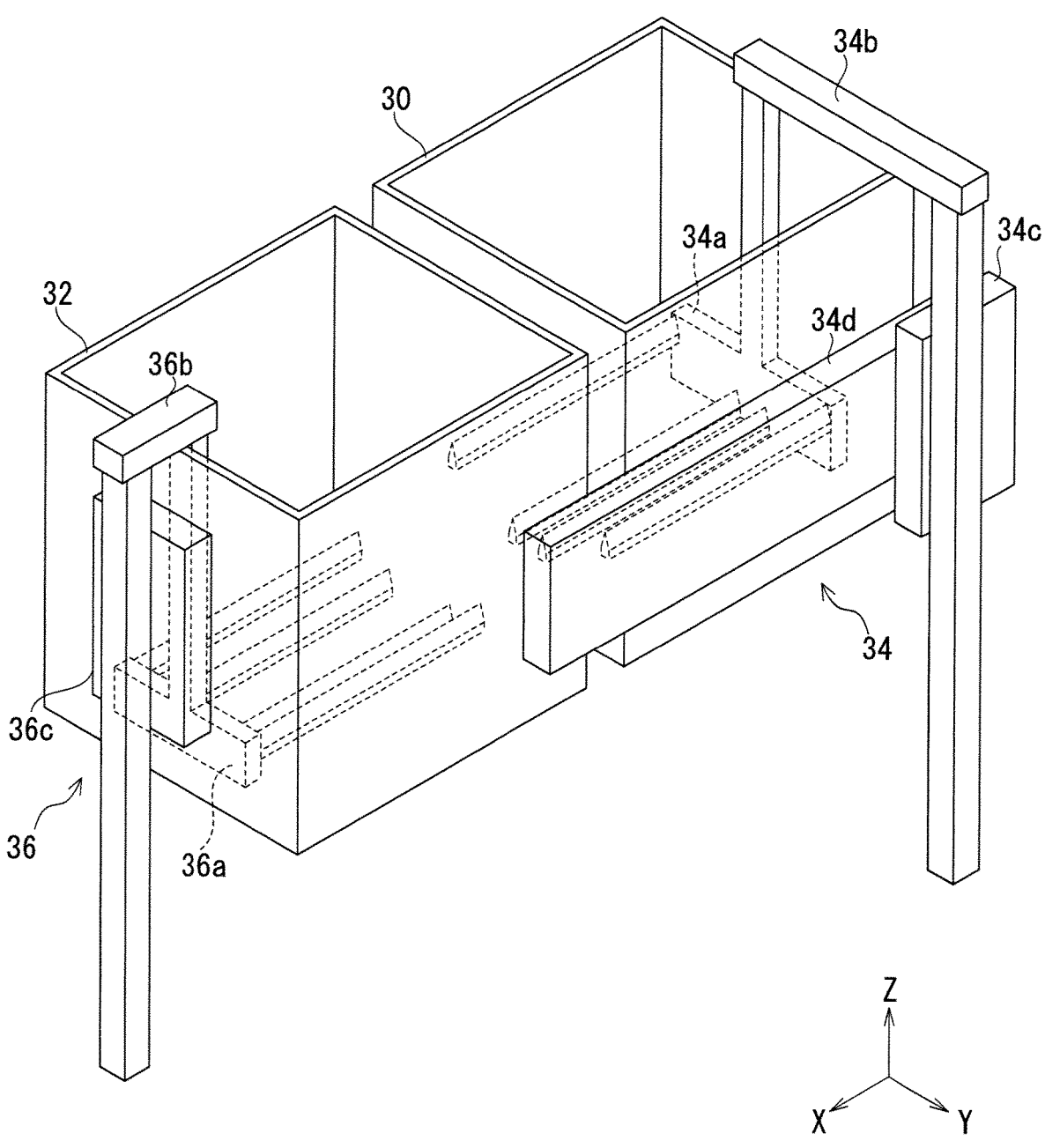
FIG. 3B is a perspective view illustrating a state in which the first chuck of one first transport unit and the second chuck of the other first transport unit are located inside the first tank and the second tank, respectively.
Figure 3C:
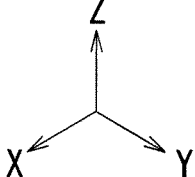
FIG. 3C is a perspective view illustrating a state in which both the first chuck of one first transport unit and the second chuck of the other first transport unit are located above the first tank.

FIG. 3A is a perspective view illustrating a state in which a first chuck of one first transport unit and a second chuck of the other first transport unit are located above the first tank and the second tank, respectively. Furthermore, FIG. 3B is a perspective view illustrating a state in which the first chuck of one first transport unit and the second chuck of the other first transport unit are located inside the first tank and the second tank, respectively. Then, FIG. 3C is a perspective view illustrating a state in which both the first chuck of one first transport unit and the second chuck of the other first transport unit are located above the first tank.

Figure 4A:
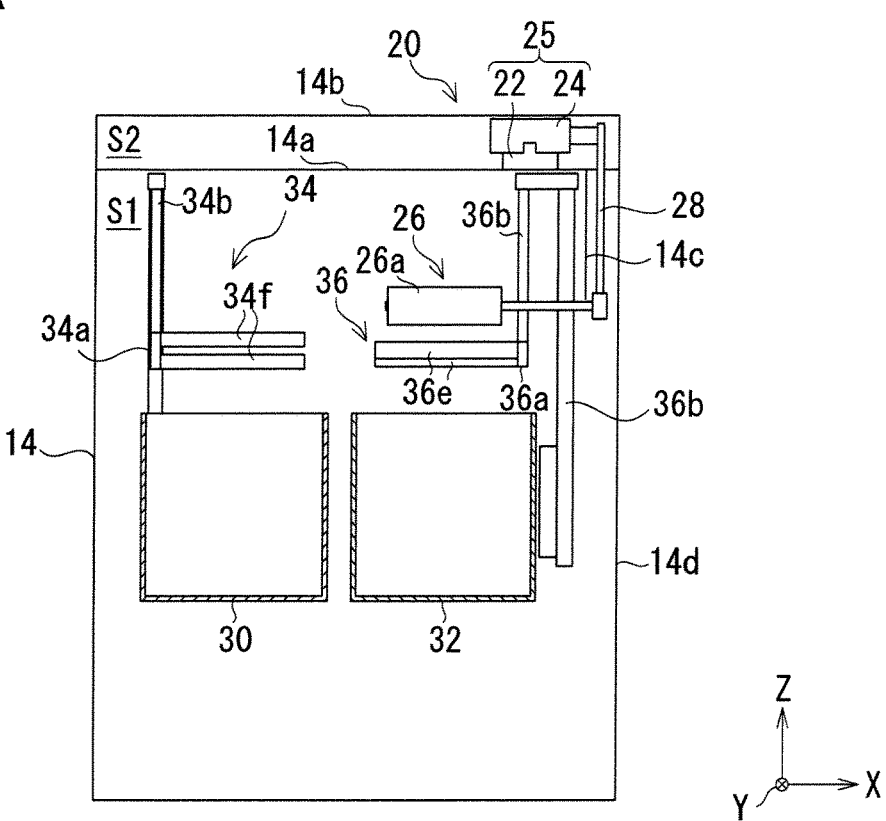
FIG. 4A is a side view illustrating a state in which a first chuck of one first transport unit and a second chuck of the other first transport unit are located above the first tank and the second tank, respectively.
Figure 4B:
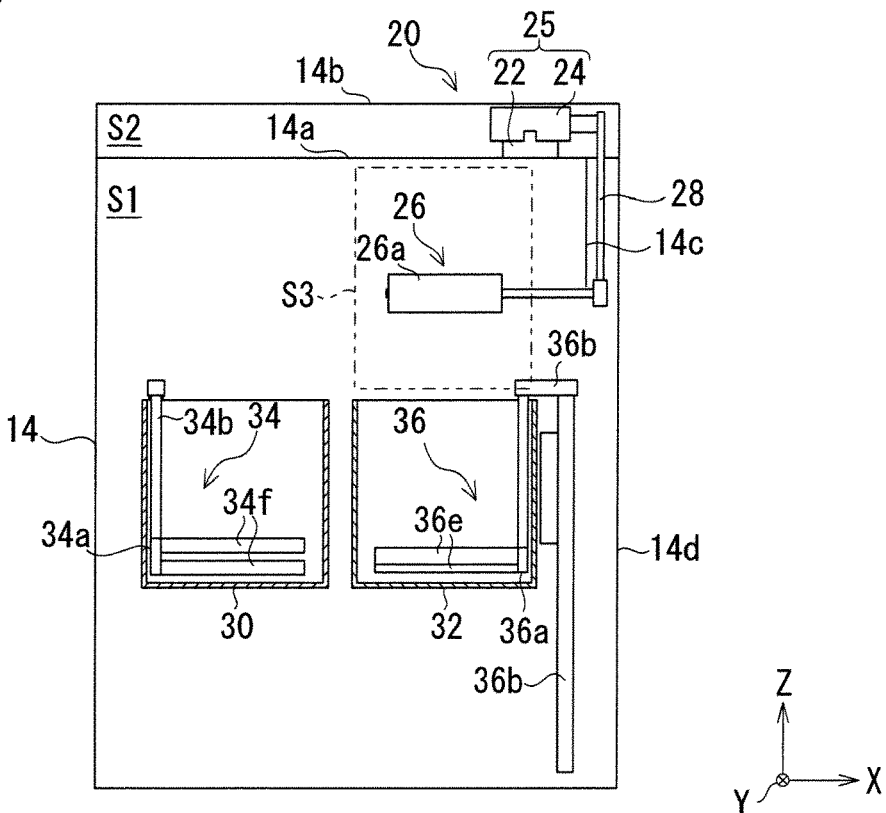
FIG. 4B is a side view illustrating a state in which the first chuck of one first transport unit and the second chuck of the other first transport unit are located inside the first tank and the second tank, respectively.
Figure 4C:
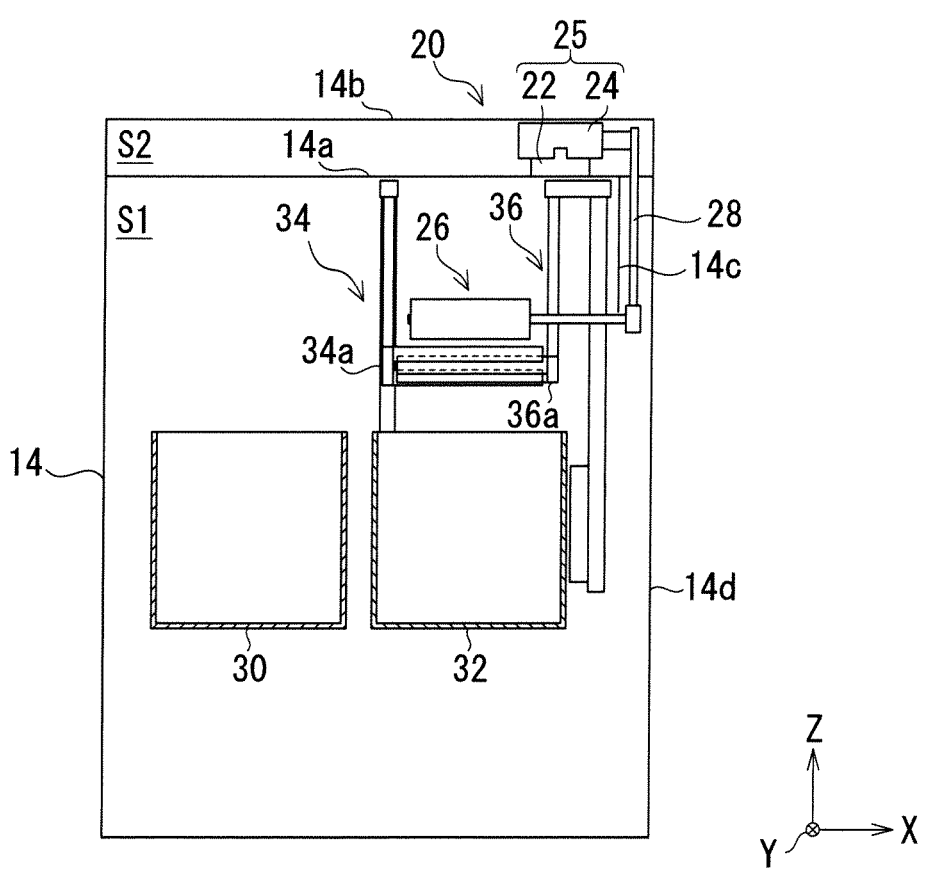
FIG. 4C is a side view illustrating a state in which both the first chuck of one first transport unit and the second chuck of the other first transport unit are located above the first tank.

Moreover, FIG. 4A is a side view illustrating a state in which the first chuck of one first transport unit and the second chuck of the other first transport unit are located above the first tank and the second tank, respectively. Furthermore, FIG. 4B is a side view illustrating a state in which the first chuck of one first transport unit and the second chuck of the other first transport unit are located inside the first tank and the second tank, respectively. Then, FIG. 4C is a side view illustrating a state in which both the first chuck of one first transport unit and the second chuck of the other first transport unit are located above the first tank. Note that FIGS. 3A and 4A correspond to each other, FIGS. 3B and 4B correspond to each other, and FIGS. 3C and 4C correspond to each other.

As illustrated in FIGS. 3A to 3C and FIGS. 4A to 4C, in the case of the present first embodiment, the other first transport unit 34 includes a second chuck 34a that holds the plurality of substrates W, an arm 34b that supports the second chuck 34a, an actuator 34c that raises and lowers the arm 34b in the Z-axis direction (third direction), and an actuator 34d that moves the actuator 34c in the X-axis direction (first direction).

The second chuck 34a can be moved up and down by the actuator 34c. As a result, the second chuck 34a can be disposed in the second tank 30 as illustrated in FIGS. 3B and 4B. Furthermore, the actuator 34d allows the second chuck 34a to move between a position above the second tank 30 and a position above the first tank 32 as illustrated in FIGS. 3A, 3C, 4A, and 4C.

In the case of the present first embodiment, one first transport unit 36 includes a first chuck 36a that holds the plurality of substrates W, an arm 36b that supports the first chuck 36a, and an actuator 36c that raises and lowers the arm 36b in the Z-axis direction (third direction).

The first chuck 36a can be moved up and down by the actuator 36c. As a result, the first chuck 36a can be disposed in the first tank 32 as illustrated in FIGS. 3B and 4B. Note that, in the case of the present first embodiment, the first chuck 36a does not move in the X-axis direction (first direction) unlike the second chuck 34a.

Furthermore, as illustrated in FIG. 3A, the actuator 34c and the actuator 34d of the first transport unit 34 are disposed on one side (right side in the case of the present first embodiment) in the Y-axis direction (second direction) with respect to the second tank 30. The actuator 36c of the first transport unit 36 is provided on one side in the X-axis direction (first direction) with respect to the first tank 32, that is, in front of the first tank 32 (on an opposite side of the second tank 30 across the first tank 32).

As illustrated in FIG. 3A, in the case of the present first embodiment, the second chuck 34a of the first transport unit 34 and the first chuck 36a of the first transport unit 36 have shapes corresponding to each other so that the substrate W can be transferred to and from each other.

For example, in the case of the present first embodiment, the second chuck 34a and the first chuck 36a are comb-shaped chucks in an upward view (as viewed in the Z-axis direction).

Specifically, the second chuck 34a includes a main body portion 34e connected to the arm 34b, and a plurality of support rods 34f extending forward in the X-axis direction (first direction) from the main body portion 34e and on which the plurality of substrates W is placed. Similarly, the first chuck 36a includes a main body portion 36d connected to the arm 36b, and a plurality of support rods 36e extending rearward in the X axis direction from the main body portion 36d and on which the plurality of substrates W is placed. Each of the support rods 34f and 36e is formed with a plurality of grooves (not illustrated) that are engaged with outer circumferential ends of the plurality of substrates W to maintain the plurality of substrates W in a state of being spaced apart from each other by a predetermined interval. As a result, the plurality of substrates W are held by the first and second chucks 36a and 34a in a state of being overlapped at intervals in the X-axis direction. Note that, in the present first embodiment, the second chuck 34a and the first chuck 36a include four support rods 34f and 36e, respectively. The number of support rods on which the substrates W are placed may be three or more, and the second chuck 34a and the first chuck 36a may be different from each other.

Furthermore, in the case of the present first embodiment, the second chuck 34a and the first chuck 36a are configured such that the plurality of support rods 34f and 36e can pass through each other in the Z-axis direction (third direction).

Figure 5:
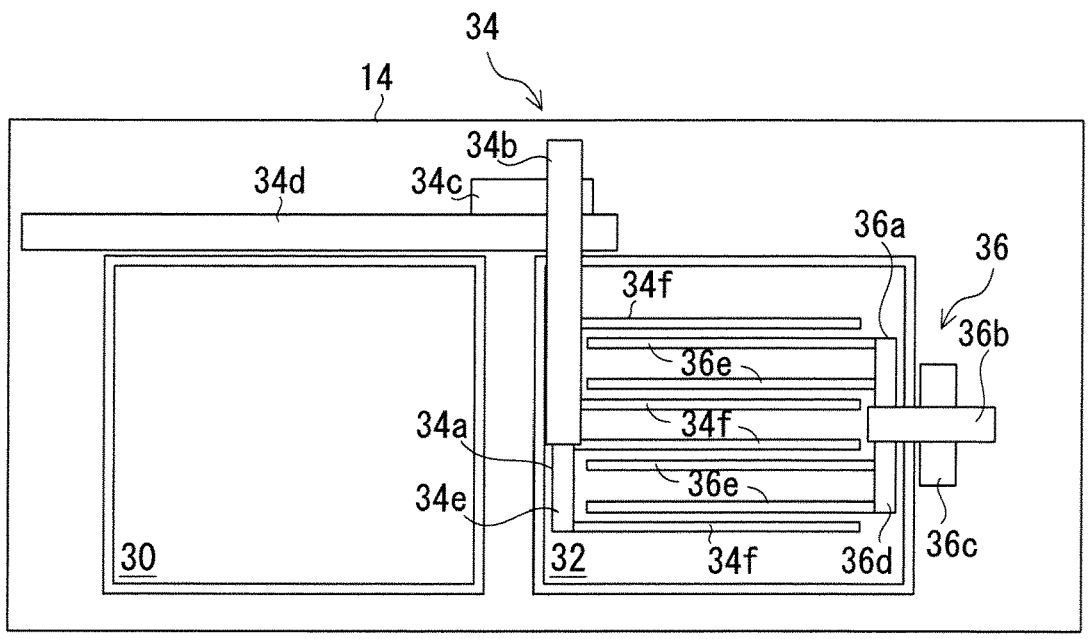
FIG. 5 is a top view illustrating a state in which both the first chuck of one first transport unit and the second chuck of the other first transport unit are located above the first tank.

FIG. 5 is a top view illustrating a state in which both the first chuck of one first transport unit and the second chuck of the other first transport unit are located above the first tank. Furthermore, FIG. 6 is a diagram illustrating transfer of the substrate between the first chuck and the second chuck.

As illustrated in FIG. 5, in the case of the present first embodiment, the transfer of the plurality of substrates W between the second chuck 34a and the first chuck 36a is performed above the first tank 32. At the time of transferring the substrate W, the plurality of support rods 34f of the second chuck 34a and the plurality of support rods 36e of the first chuck 36a are located between the main body portion 34e of the second chuck 34a and the main body portion 36d of the first chuck 36a. As a result, as illustrated in FIG. 6, the plurality of support rods 34f of the second chuck 34a and the plurality of support rods 36e of the first chuck 36a can simultaneously contact the plurality of substrates W.

Figure 6:
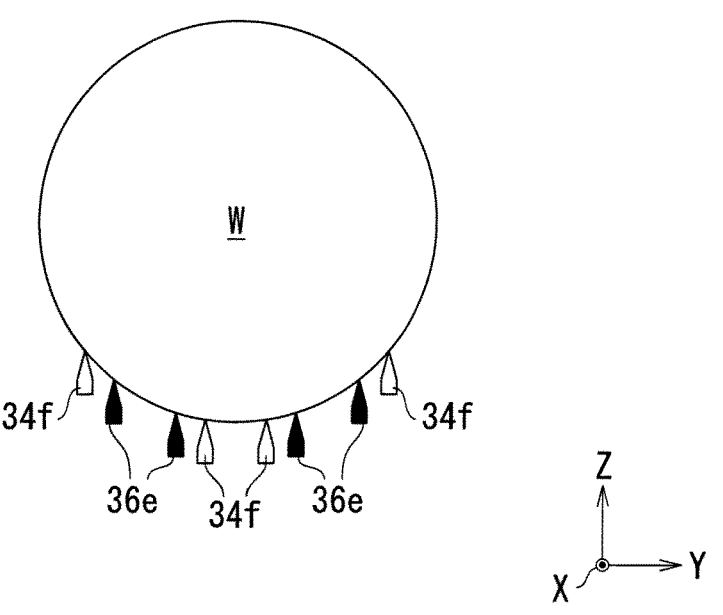
FIG. 6 is a diagram illustrating transfer of a substrate between the first chuck and the second chuck.

Furthermore, as illustrated in FIGS. 5 and 6, at the time of transferring the substrate W, the support rods 34f of the second chuck 34a and the plurality of support rods 36e of the first chuck 36a do not overlap each other in the Z-axis direction (third direction) of the first and second chucks 36a and 34a. Therefore, the first and second chucks 36a, 34a can pass in the Z-axis direction with respect to each other without contact between the support rods of each other. For example, when the second chuck 34a is lowered from the state illustrated in FIG. 6, the plurality of substrates W remain on the plurality of support rods 36e of the first chuck 36a, and the plurality of substrates W are transferred to the first chuck 36a.

In the case of the present first embodiment, the plurality of substrates W are supplied from the loading module 12 to the second chuck 34a of the first transport unit 34 by the second transport unit 20, and then transferred from the second chuck 34a to the first chuck 36a of the first transport unit 36. Then, the plurality of substrates W on the first chuck 36a are collected by the second transport unit 20 and transported to the drying module 16. In the case of the present first embodiment, the supply of the substrate W to the second chuck 34a of the first transport unit 34 and the collection of the substrate W from the first chuck 36a of the first transport unit 36 are executed by the common second transport unit 20.

Figures 7, 8:
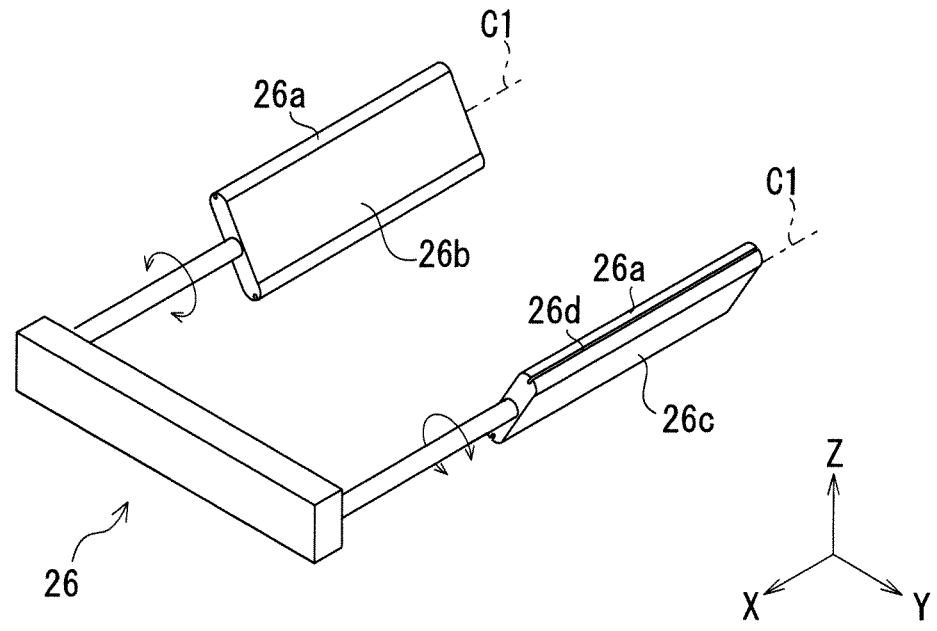
FIG. 7 is a perspective view of a second transport unit holding a substrate in the substrate processing device according to the first embodiment.
FIG. 8 is a perspective view illustrating a chuck in the second transport unit of the substrate processing device according to the first embodiment.
Figure 9:
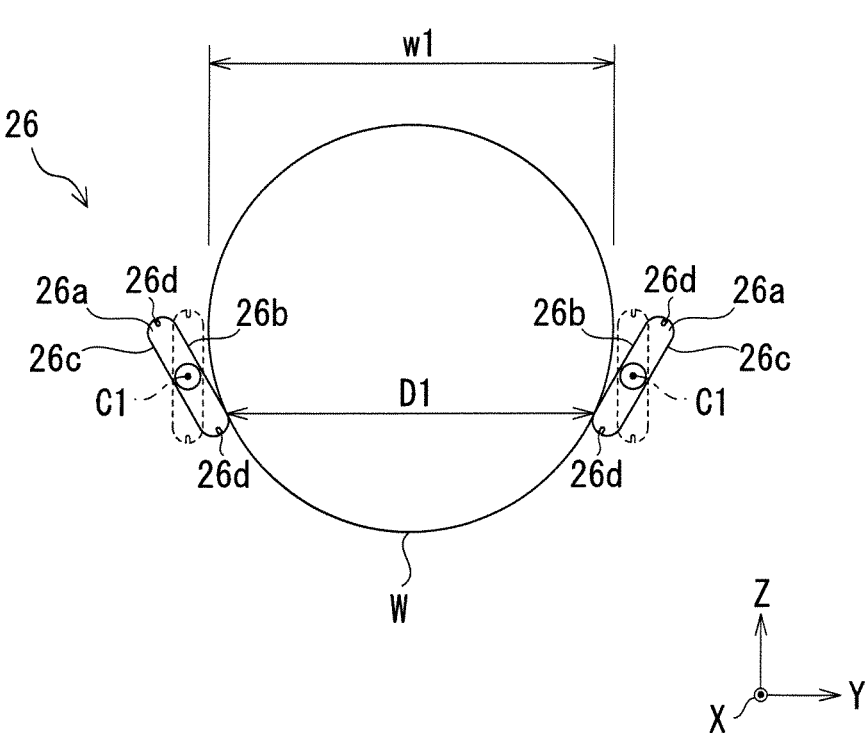
FIG. 9 is a diagram illustrating holding and releasing of a substrate of a chuck.

FIG. 7 is a perspective view of the second transport unit holding the substrate in the substrate processing device according to the first embodiment. Furthermore, FIG. 8 is a perspective view illustrating the chuck in the second transport unit. Moreover, FIG. 9 is a diagram illustrating holding and releasing of the substrate of the chuck.

As illustrated in FIG. 1, in the case of the present first embodiment, the moving head 24 of the actuator 25 of the second transport unit 20 moves on the rail 22 disposed in the front portion and the upper portion of the substrate processing device 10 (that is, each of the modules 12 to 18) and extending in the Y-axis direction (second direction). As illustrated in FIGS. 4A to 4C, in the chemical module 14, the actuator 25 is disposed on a side of the first tank 32 in the X-axis direction (first direction). Furthermore, in the case of the present first embodiment, the actuator 25 is located above the first tank 32. Therefore, the moving head 24 of the actuator 25 moves in the Y-axis direction above the first tank 32.

In the case of the present first embodiment, as illustrated in FIGS. 4A to 4C, in the chemical module 14, the actuator 25 of the second transport unit 20 is disposed in a drive space S2 isolated from a treatment space S1 in which the first tank 32 and the second tank 30 are disposed. The drive space S2 is provided above the treatment space S1. The actuator 25 is laid on an inner top plate portion 14a of the chemical module 14 that separates the treatment space S1 and the drive space S2. That is, the inner top plate portion 14a exists between the first tank 32 and the moving head 24 moving on the rail 22 of the actuator 25. The inner top plate portion 14a prevents foreign matter generated by the movement of the moving head 24 on the rail 22 from falling into the first tank 32.

Note that, in the present first embodiment, the chemical module 14 includes the inner top plate portion 14a and an outer top plate portion 14b disposed above the inner top plate portion. The actuator 25 is disposed in the drive space S2 formed between the inner top plate portion 14a and the outer top plate portion 14b.

As illustrated in FIG. 8, in the case of the present first embodiment, the chuck 26 in the second transport unit 20 includes a pair of chucking claws 26a that rotate about a rotation center line C1 extending in the X-axis direction (first direction) of the substrate processing device 10. The chucking claws 26a are disposed to face each other in the Y-axis direction (second direction) of the substrate processing device 10.

As illustrated in FIG. 9, each of the chucking claws 26a of the chuck 26 has a non-circular shape as viewed in an extending direction of the rotation center line C1 (that is, as viewed in the X-axis direction (first direction)), and has an oval coin shape in the case of the present first embodiment. In the case of the present first embodiment, the rotation center line C1 passes through a shape center of the chucking claw 26a as viewed in the first direction. Note that the rotation center line C1 may deviate from the shape center as long as the chucking claw 26a can hold the plurality of substrates W. Furthermore, as long as the function of the chuck 26 is not impaired, the shape of the chucking claw 26a is not particularly limited, and may be, for example, an elliptical shape, a rectangular shape, a triangular shape, or the like. Each of the chucking claws 26a includes a first support surface 26b and a second support surface 26c that support outer circumferential ends of the plurality of substrates W.

As illustrated in FIG. 9, the chuck 26 holds or releases the substrate W by rotation of each of the pair of chucking claws 26a. Specifically, each of the pair of chucking claws 26a takes a holding posture (posture indicated by solid line) such that a shortest distance D1 between the pair of chucking claws 26a is smaller than a size w1 of the substrate W in the Y-axis direction (second direction) of the substrate processing device 10, whereby the chuck 26 can hold the substrate W. Furthermore, when each of the pair of chucking claws 26a takes a release posture (posture indicated by a broken line) in which the shortest distance D1 becomes larger than the size w1 of the substrate W in the Y axis direction, the chuck 26 can release the substrate W. That is, when the pair of chucking claws 26a take the release posture, the substrate W can pass between the pair of chucking claws 26a in the Z-axis direction (third direction) of the substrate processing device 10. Note that the first and second support surfaces 26b and 26c of each of the pair of chucking claws 26a are formed with a plurality of grooves (not illustrated) that are engaged with the outer circumferential end of each of the plurality of substrates W to maintain the plurality of substrates W in a state of being spaced apart from each other by a predetermined distance.

As illustrated in FIGS. 4A to 4C, the chuck 26 is disposed above the first tank 32. By the movement of the moving head 24 of the actuator 25 in the Y-axis direction (second direction), the chuck 26 passes above the first tank 32 in the Y-axis direction. For this purpose, the second transport unit 20 includes an arm 28 that connects the moving head 24 and the chuck 26.

In the case of the present first embodiment, as illustrated in FIGS. 4A to 4C, the moving head 24 is disposed above the chuck 26. Therefore, the arm 28 connecting them extends in the height direction (Z-axis direction) of the substrate processing device 10 and supports the chuck 26 at a lower end thereof. The arm 28 extending in the height direction as described above is less likely to bend than the arm extending in the X-axis direction (first direction).

Specifically, in a case where the moving head 24 does not exist above the chuck 26, the arm 28 includes at least a portion extending in the X-axis direction (first direction). The portion of the arm 28 extending in the first direction as described above is likely to be greatly bent by its own weight and the weight of the chuck 26. In particular, when the moving head 24 is stopped, the arm 28 is likely to be greatly bent due to inertia of the chuck 26.

Furthermore, as illustrated in FIGS. 4A to 4C, the arm 28 extends at a position away from above the first tank 32. Specifically, as illustrated in FIG. 4B, the arm 28 does not extend in the treatment space S1 and in a space S3 above the first tank 32. As a result, the arm 28 does not pass above the first tank 32. This prevents foreign matter adhering to the arm 28 from falling into the first tank 32.

Furthermore, in the case of the present first embodiment, as illustrated in FIG. 4B, the chemical module 14 includes a hanging plate 14c that partitions the space S3 above the first tank 32 and the arm 28 as viewed in the Y-axis direction (second direction). The hanging plate 14c extends in the Z-axis direction (third direction) from the inner top plate portion 14a. This hanging plate 14c suppresses movement of foreign matter adhering to the arm 28 toward the first tank 32.

Note that, in the case of the present first embodiment, the chemical module 14 includes an outer wall portion 14d disposed outside the hanging plate 14c together with the hanging plate. The arm 28 moves between the hanging plate 14c and the outer wall portion 14d.

As described above, the chuck 26 of the second transport unit 20 passes above the first tank 32 in the Y-axis direction (second direction). Therefore, the transfer of the substrate W from the chuck 26 to the second chuck 34a of the first transport unit 34 (that is, the supply of the substrate W) is performed above the first tank 32.

Figure 10:
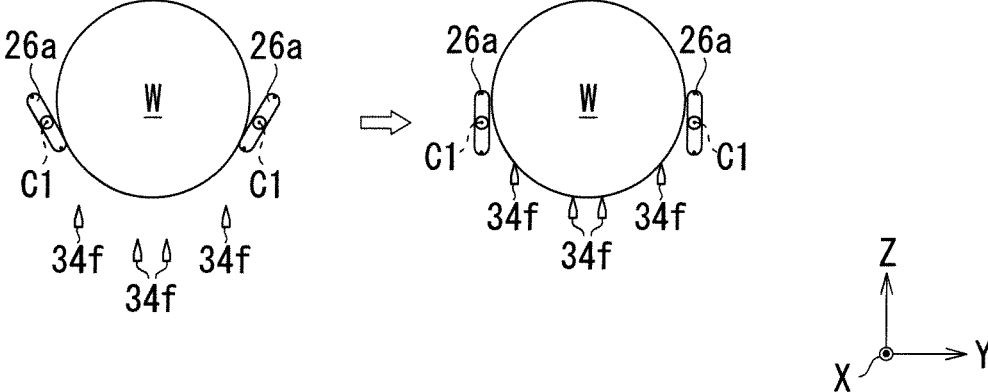
FIG. 10 is a diagram illustrating transfer of a substrate from the chuck of the second transport unit to a second chuck of the other first transport unit.

FIG. 10 is a diagram illustrating transfer of the substrate from the chuck of the second transport unit to the second chuck of the other first transport unit.

First, the chuck 26 of the second transport unit 20 that has received the plurality of substrates W in the loading module 12 arrives above the first tank 32 of the chemical module 14. Before or after the arrival, the plurality of support rods 34f of the second chuck 34a of the first transport unit 34 is disposed below the chuck 26. Next, the second chuck 34a rises, and the plurality of support rods 34f come into contact with the outer circumferential ends of the plurality of substrates W held by the chuck 26. When the plurality of support rods 34f come into contact with the plurality of substrates W, the pair of chucking claws 26a of the chuck 26 rotate to release the plurality of substrates W. As a result, the transfer of the substrate W from the chuck 26 to the second chuck 34a is completed. The second chuck 34a that has received the substrate W moves toward an upper side of the second tank 30 in the X-axis direction (first direction), and then moves into the second tank 30. When the movement of the second chuck 34a to the second tank 30 is completed, the chuck 26 becomes movable in the Y-axis direction (second direction).

The transfer of the substrate W from the first chuck 36a of the first transport unit 36 to the chuck 26 (that is, the collection of the substrate W) is also performed above the first tank 32.

Figure 11:
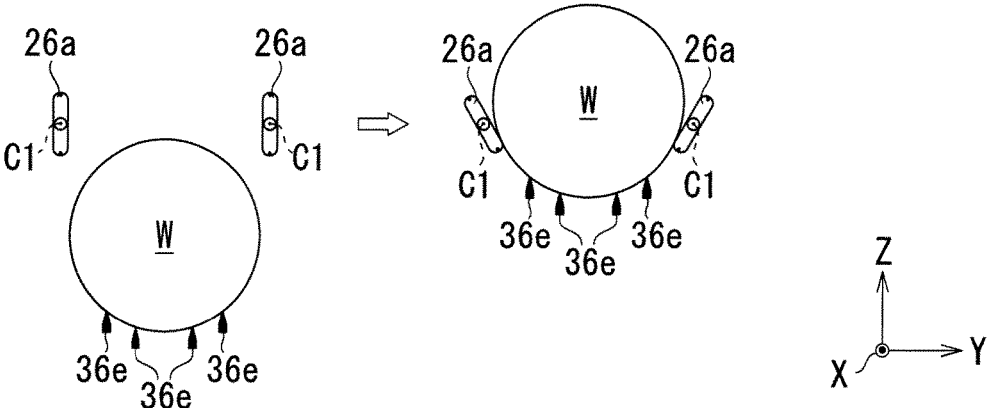
FIG. 11 is a diagram illustrating transfer of a substrate from the first chuck of one first transport unit to the chuck of the second transport unit.

FIG. 11 is a diagram illustrating transfer of the substrate from the first chuck of one of the first transport units to the chuck of the second transport unit.

First, the chuck 26 of the second transport unit 20 arrives above the first tank 32 of the chemical module 14. Then, the pair of chucking claws 26a of the chuck 26 takes the release posture in which the substrate W can pass between the pair of chucking claws in the Z-axis direction (third direction). Thereafter, the first chuck 36a of the first transport unit 36 moves upward from the inside of the first tank 32 in a state of holding the plurality of substrates W. When a part of the plurality of substrates W passes between the pair of chucking claws 26a, the pair of chucking claws 26a rotates to take the holding posture from the release posture. As a result, the transfer of the substrate W to the pair of chucking claws 26a is completed. When the transfer is completed, the first chuck 36a descends and moves into the first tank 32. When this movement is completed, the chuck 26 becomes movable in the Y-axis direction (second direction).

To supplement, when the substrate W is transferred from the first chuck 36a of the first transport unit 36 to the chuck 26, as illustrated in FIG. 4A, the arm 36b of the first transport unit 36 and the chucking claw 26a of the chuck 26 overlap each other as viewed in the Y axis direction (second direction). That is, the arm 36b is located between the pair of chucking claws 26a as viewed in an upward direction (as viewed in the Z-axis direction). In this state, since the chuck 26 cannot move in the Y-axis direction, the first chuck 36a that has transferred the plurality of substrates W to the chuck 26 retreats into the first tank 32. As a result, as illustrated in FIG. 4B, the chuck 26 can move in the Y-axis direction without being obstructed by the arm 36b.

Note that, in the case of the present first embodiment, as described above, the chuck 26 of the second transport unit 20 transports the substrate W from the loading module 12 to the second chuck 34a of the first transport unit 34 of the chemical module 14, and transports the substrate W from the first chuck 36a of the first transport unit 36 to the drying module 16. That is, the chuck 26 transports the substrate W before the treatment in a dry state, and transports the substrate W after the treatment wetted with the cleaning liquid in the first tank 32. Therefore, as illustrated in FIG. 9, the pair of chucking claws 26a of the chuck 26 includes the first support surface 26b that supports the dry substrate W and the second support surface 26c that supports the wet substrate W. This prevents the dry substrate W from being supported on the wet support surface. Note that, between the first support surface 26b and the second support surface 26c, a groove 26d extending in the X-axis direction (first direction) in which the rotation center line C1 of the chucking claw 26a extends is formed so that the cleaning liquid on the second support surface 26c does not move onto the first support surface 26b. Note that a nozzle (not illustrated) that sucks and collects the cleaning liquid accumulated in the groove 26d may be provided in the chucking claw 26a.

The configuration of the substrate processing device 10 has been described so far. Hereinafter, operations related to the chemical module 14 of the substrate processing device 10, that is, operations of the first transport units 34 and 36 and the second transport unit 20 will be described.

FIGS. 12A to 12J illustrate a plurality of operations in one example of substrate processing executed by the substrate processing device. Note that, in each of FIGS. 12A to 12J, a side view (left view) and a front view (right view) of the chemical module are illustrated.

Figure 12A:
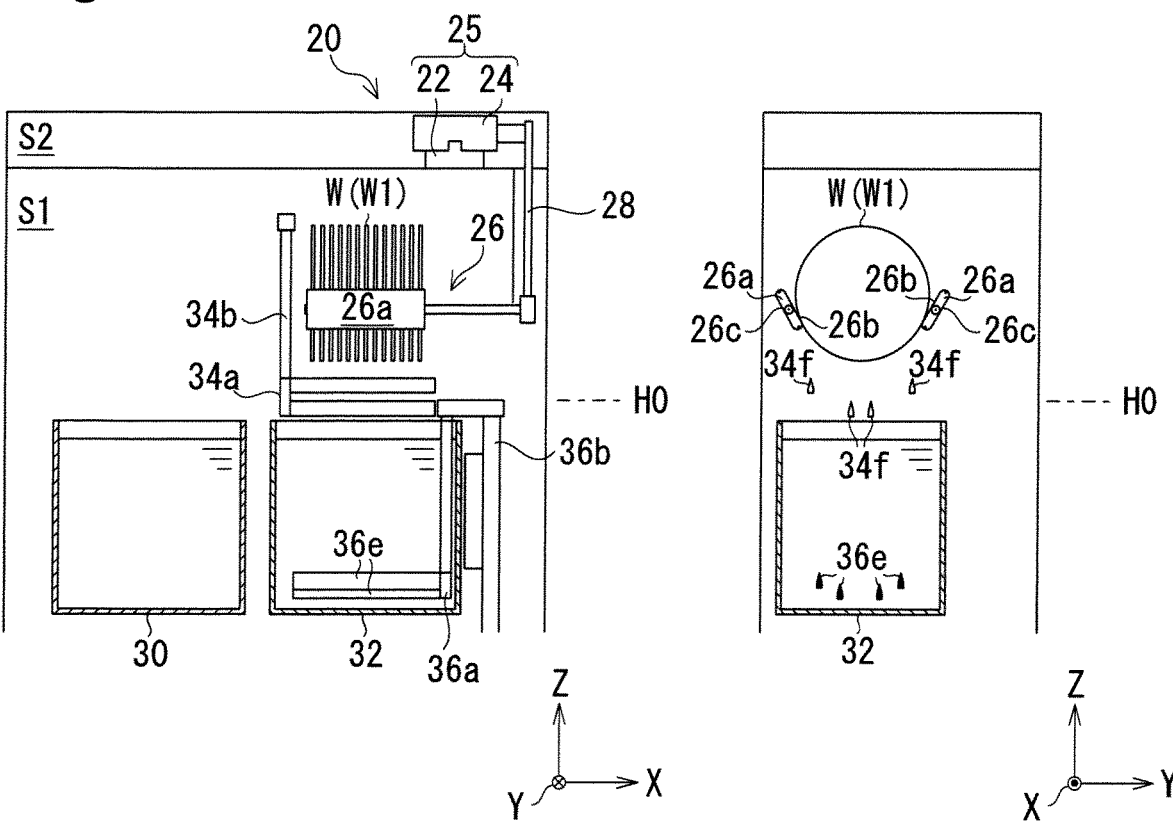
FIG. 12A is a diagram illustrating one operation in one example of substrate processing executed by the substrate processing device.

As illustrated in FIG. 12A, first, the second chuck 34a of the first transport unit 34 is on standby at a position (initial position) of a reference height H0 above the first tank 32. Furthermore, the first chuck 36a of the first transport unit 36 is on standby in the first tank 32. In this state, the chuck 26 of the second transport unit 20 transports the plurality of substrates W (preceding substrates W1) to be processed to a position above the first tank 32 at a level higher than the reference height H0.

Figure 12B:
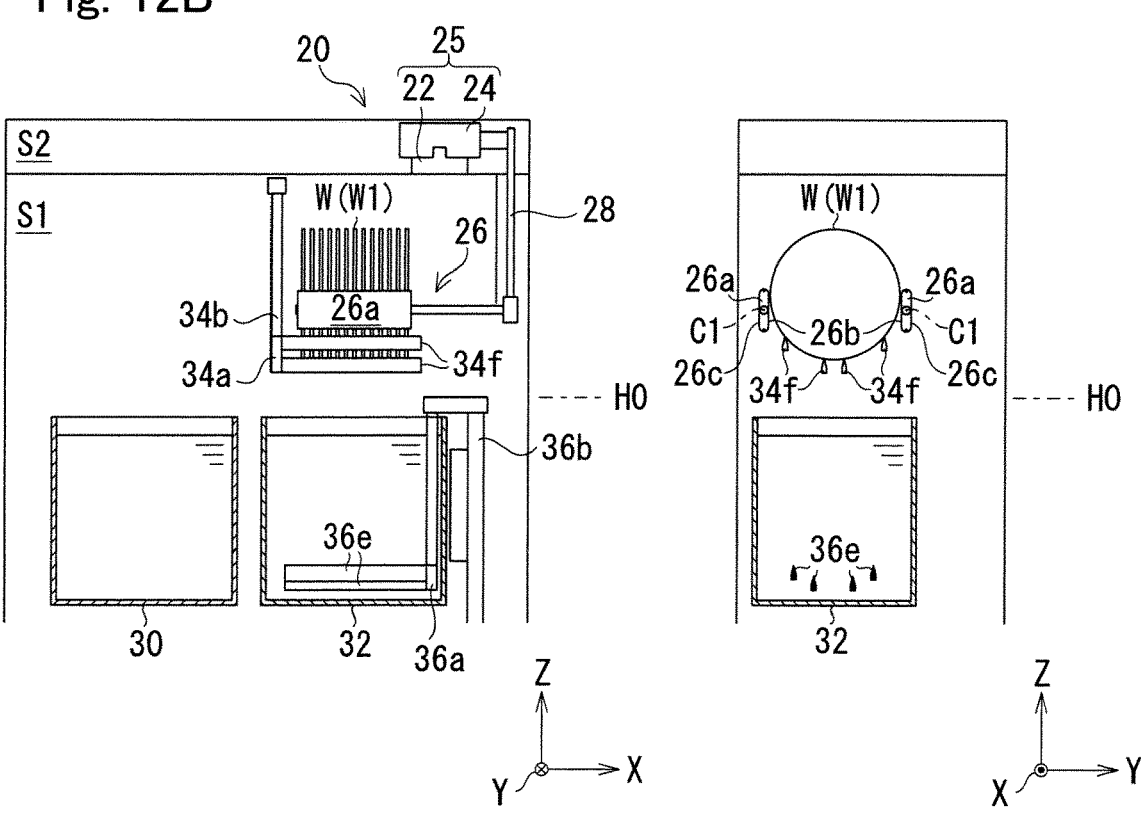
FIG. 12B is a diagram illustrating an operation subsequent to the operation illustrated in FIG. 12A.

Next, as illustrated in FIG. 12B, the second chuck 34a of the first transport unit 34 is raised, so that the plurality of substrates W (preceding substrates W1) held by the chuck 26 of the second transport unit 20 via the first support surface 26b is placed on the plurality of support rods 34f of the second chuck 34a. Note that at this time, the plurality of support rods 34f come into contact with the outer circumferential ends of the substrates W (preceding substrates W1) positioned between the chucking claws 26a of the chuck 26. When the plurality of substrates W (preceding substrates W1) are placed on the plurality of support rods 34f of the second chuck 34a, the chuck 26 of the second transport unit 20 releases the plurality of substrates W.

Figure 12C:
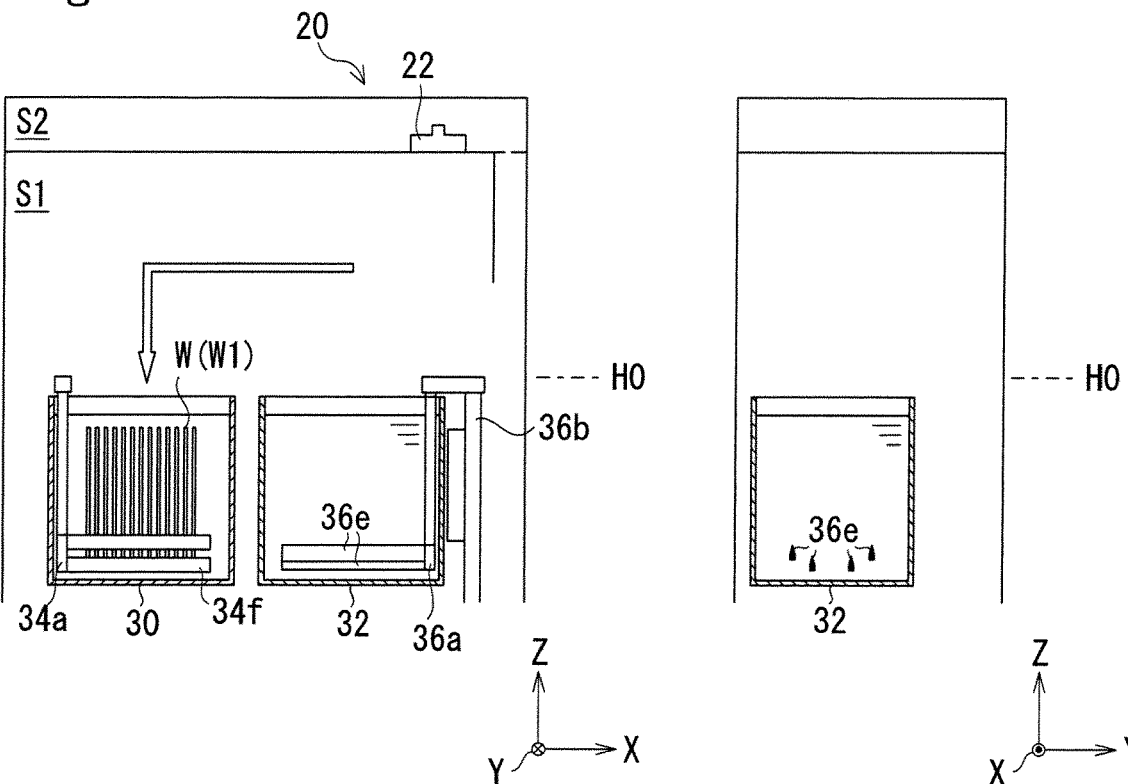
FIG. 12C is a diagram illustrating an operation subsequent to the operation illustrated in FIG. 12B.

Subsequently, as illustrated in FIG. 12C, the second chuck 34a of the first transport unit 34 on which the plurality of substrates W (preceding substrates W1) is placed moves in the X-axis direction (first direction) toward the upper side of the second tank 30, and descends into the second tank 30 after the movement. As a result, the plurality of substrates W (preceding substrates W1) are immersed in the chemical liquid in the second tank 30 and treated with the chemical liquid. When the descent of the second chuck 34a into the second tank 30 is completed, the second transport unit 20 moves to the loading module 12 to receive a substrate W (subsequent substrate) to be treated next.

Figure 12D:
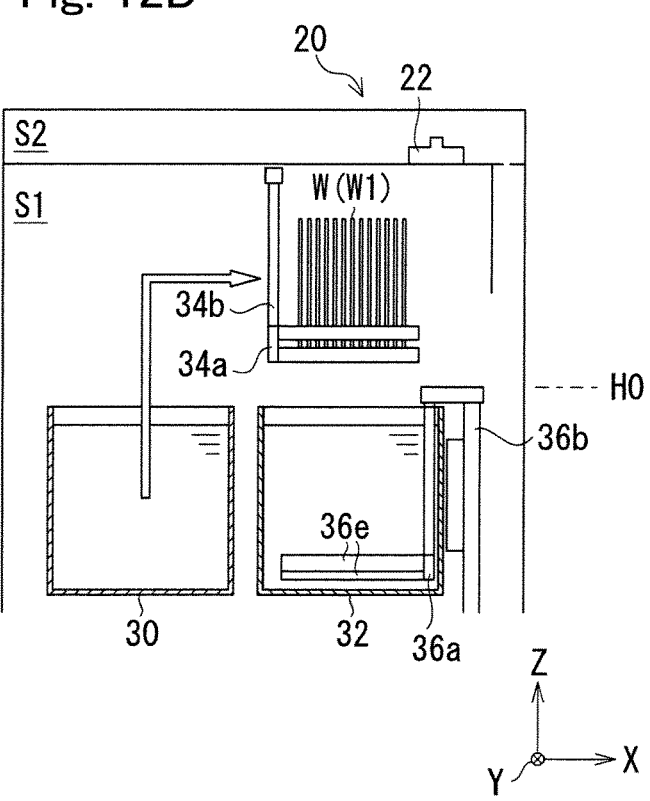
FIG. 12D is a diagram illustrating an operation subsequent to the operation illustrated in FIG. 12C.
Figure 12D:
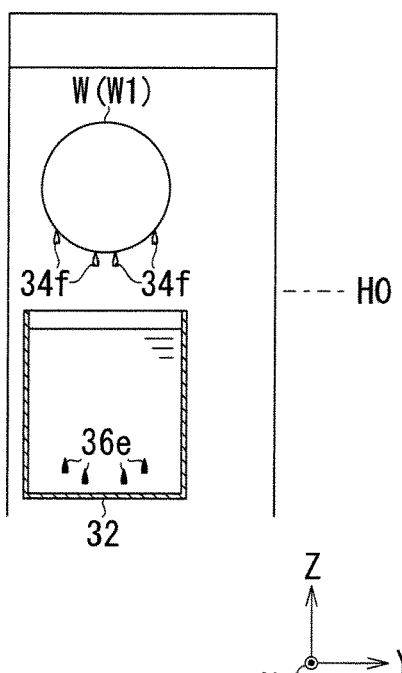

Subsequently, as illustrated in FIG. 12D, when the treatment of the substrate W (preceding substrate W1) with the chemical liquid is completed, the second chuck 34a rises toward the upper side of the second tank 30, and moves in the X-axis direction (first direction) toward the upper side of the first tank 32 after the rising. As a result, the second chuck 34a of the first transport unit 34 in a state of holding the plurality of substrates W (preceding substrates W1) subjected to the chemical liquid treatment is disposed above the first chuck 36a of the first transport unit 36.

Figure 12E:
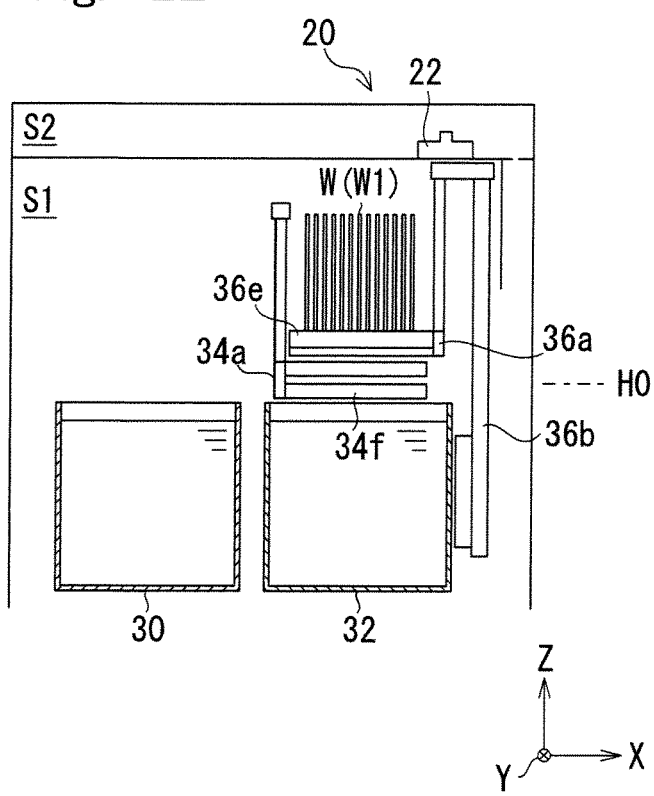
FIG. 12E is a diagram illustrating an operation subsequent to the operation illustrated in FIG. 12D.
Figure 12E:
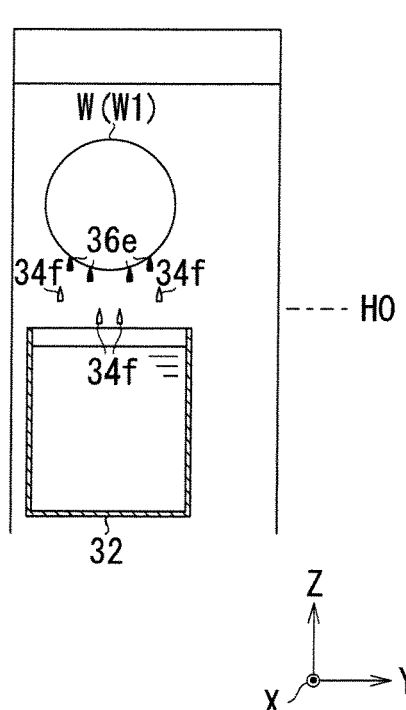

Subsequently, as illustrated in FIG. 12E, the first chuck 36a of the first transport unit 36 is raised, so that the plurality of substrates W (preceding substrate W1) placed on the plurality of support rods 34f of the second chuck 34a are placed on the plurality of support rods 36e of the first chuck 36a. Then, when the second chuck 34a descends to the initial position of the reference height H0, the transfer of the substrate W (preceding substrate W1) from the second chuck 34a to the first chuck 36a is completed.

Figure 12F:
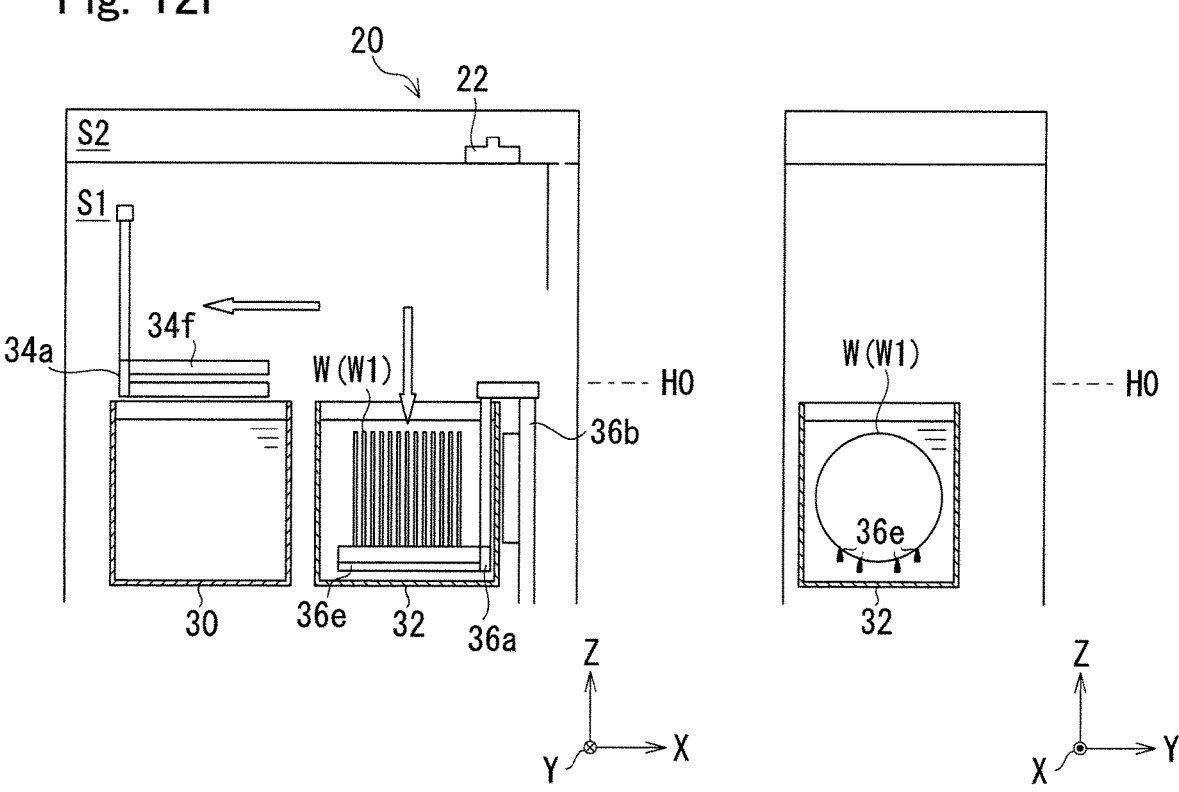
FIG. 12F is a diagram illustrating an operation subsequent to the operation illustrated in FIG. 12E.

Subsequently, as illustrated in FIG. 12F, when the transfer of the substrate W (preceding substrate W1) from the second chuck 34a to the first chuck 36a is completed, the second chuck 34a moves above the second tank 30. As a result, the first chuck 36a holding the plurality of substrates W (preceding substrates W1) can descend toward the inside of the first tank 32. As the first chuck 36a descends into the first tank 32, the plurality of substrates W (preceding substrates W1) are immersed in the cleaning liquid in the first tank 32 and cleaned.

Figure 12G:
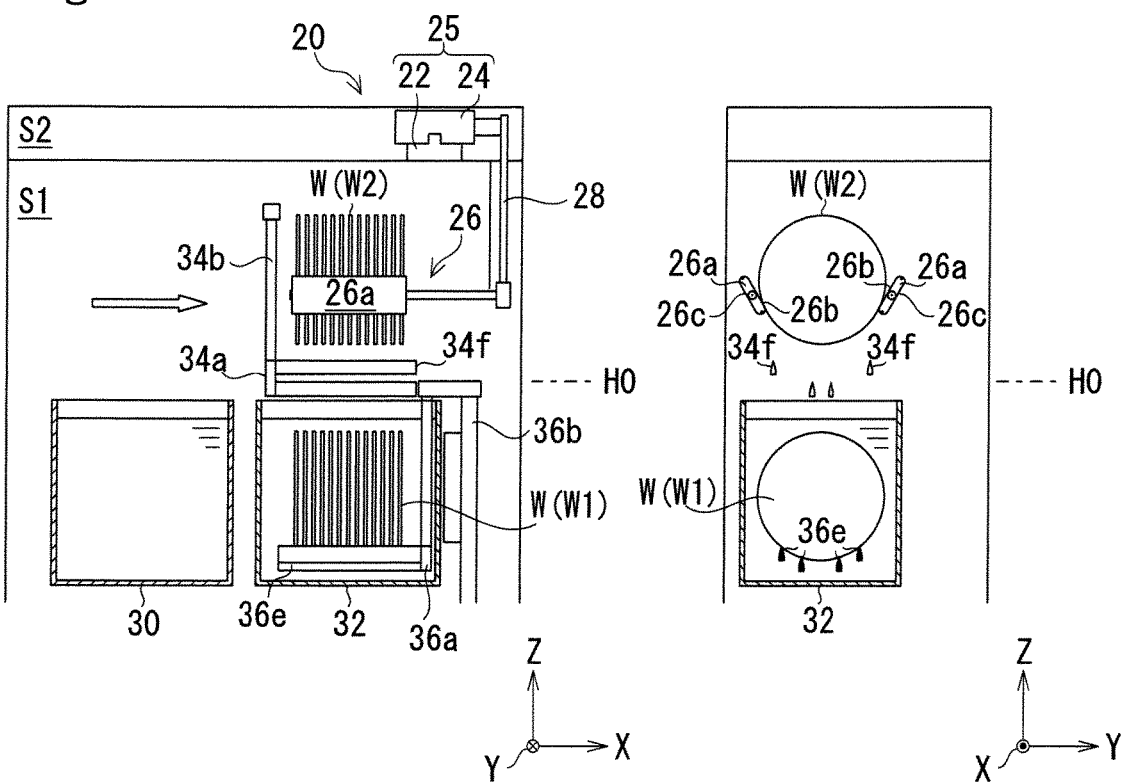
FIG. 12G is a diagram illustrating an operation subsequent to the operation illustrated in FIG. 12F.

Subsequently, as illustrated in FIG. 12G, the second chuck 34a moves above the first tank 32. Above the second chuck 34a, the chuck 26 of the second transport unit 20 in a state of holding the plurality of substrates W (the substrate W2 subsequent to the preceding substrate W1) newly received by the loading module 12 via the first support surface 26b is disposed.

Figure 12H:
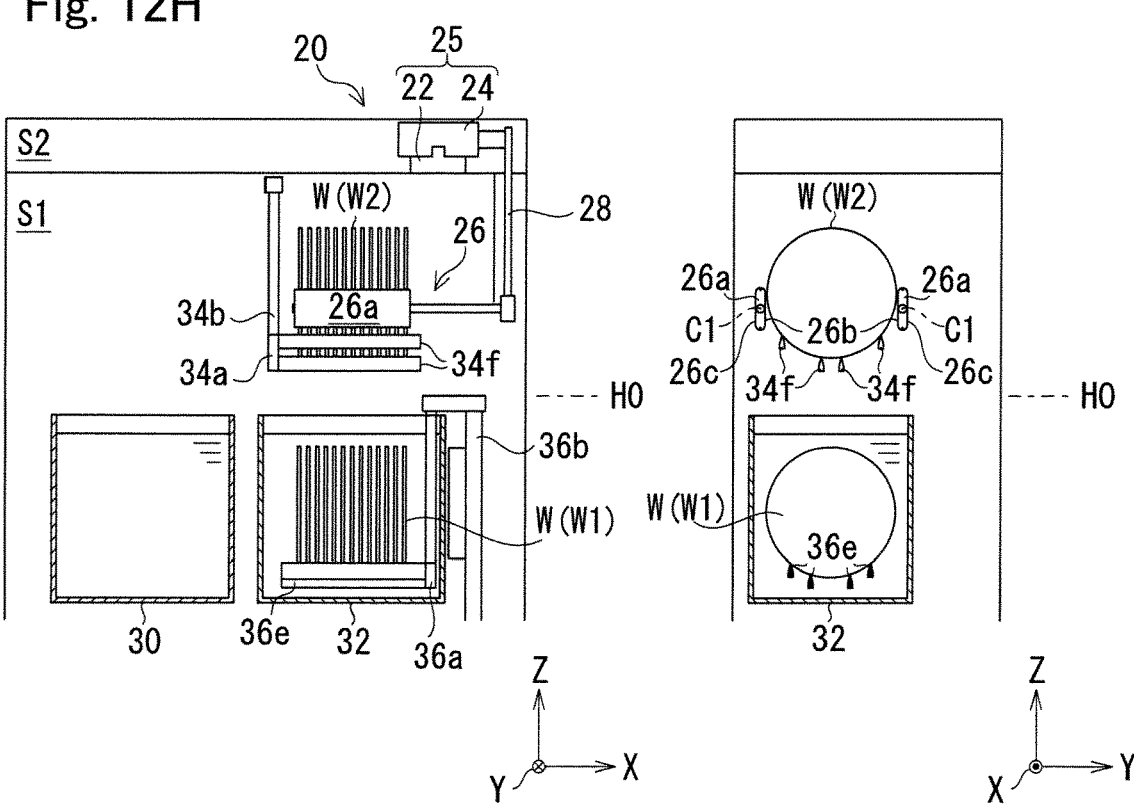
FIG. 12H is a diagram illustrating an operation subsequent to the operation illustrated in FIG. 12G.

Subsequently, as illustrated in FIG. 12H, the second chuck 34a is raised, and the plurality of substrates W (subsequent substrates W2) held by the chuck 26 of the second transport unit 20 via the first support surface 26b are placed on the plurality of support rods 34f of the second chuck 34a. When the plurality of substrates W (subsequent substrates W2) are placed on the plurality of support rods 34f of the second chuck 34a, the chuck 26 of the second transport unit 20 releases the plurality of substrates W.

Figure 12I:
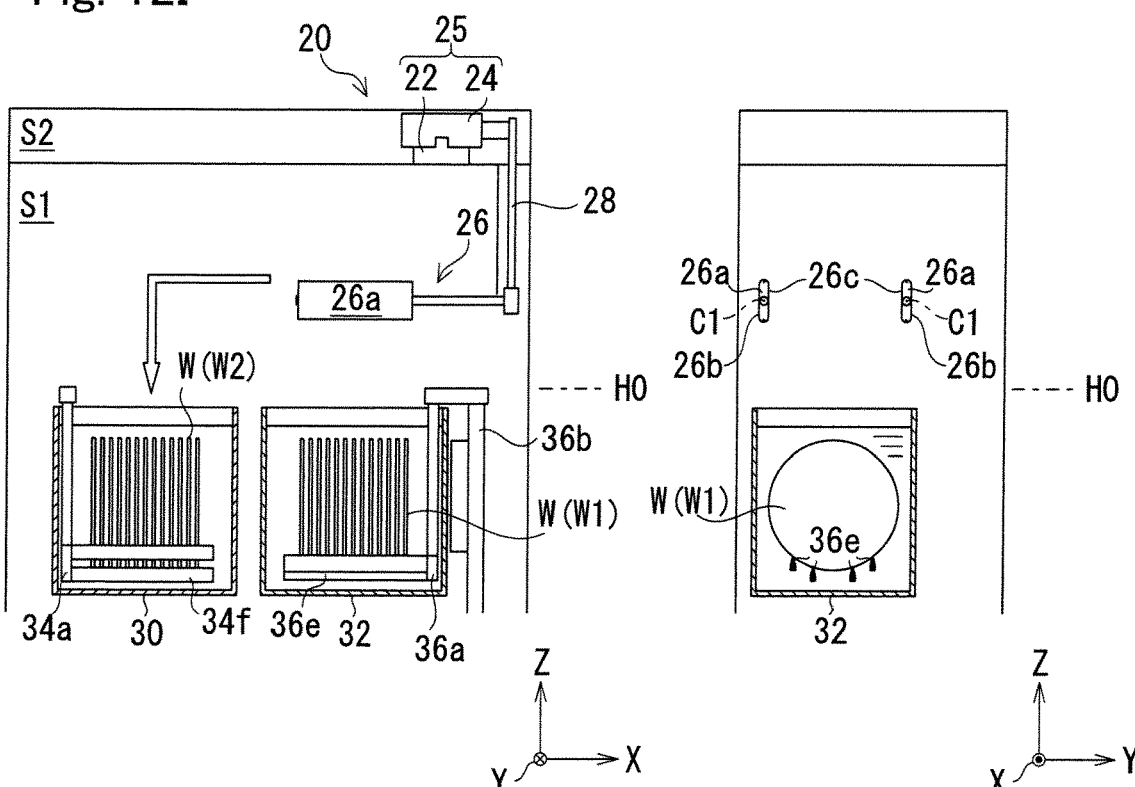
FIG. 12I is a diagram illustrating an operation subsequent to the operation illustrated in FIG. 12H.

Subsequently, as illustrated in FIG. 12I, the second chuck 34a of the first transport unit 34 in a state of holding the plurality of substrates W (subsequent substrates W2) moves in the X-axis direction (first direction) toward the upper side of the second tank 30, and descends into the second tank 30 after the movement. As a result, the plurality of substrates W (subsequent substrates W2) are immersed in the chemical liquid in the second tank 30 and treated with the chemical liquid. As a result, in the chemical module 14 of the substrate processing device 10, the plurality of substrates W (preceding substrates W1) are cleaned in the first tank 32, and the plurality of substrates W (subsequent substrates W2) are subjected to the chemical liquid treatment in the second tank 30.

Figure 12J:
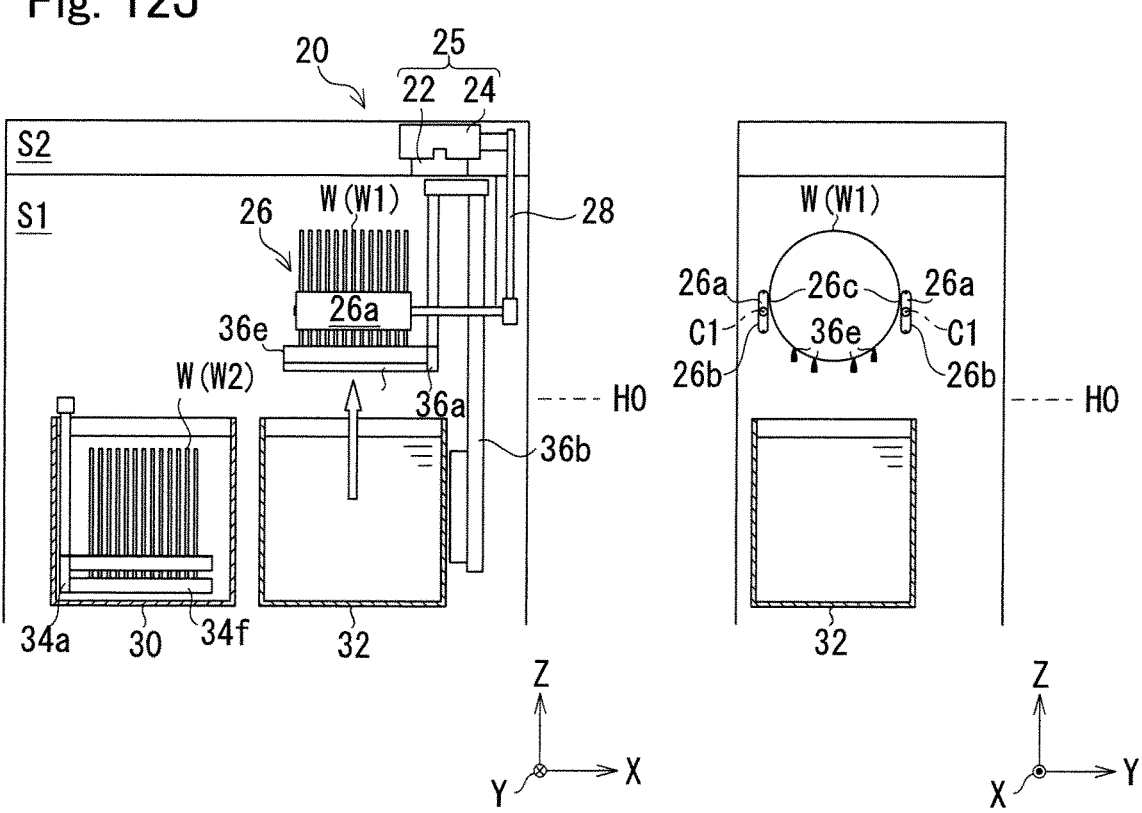
FIG. 12J is a diagram illustrating an operation subsequent to the operation illustrated in FIG. 12I.

When the cleaning of the plurality of substrates W (preceding substrate W1) in the first tank 32 is completed, the first chuck 36a rises as illustrated in FIG. 12J. The plurality of substrates W (preceding substrates W1) placed on the plurality of support rods 36e of the raised first chuck 36a is held by the chuck 26 of the second transport unit 20 via the second support surface 26c. By holding the plurality of substrates W (preceding substrates W1) wetted with the cleaning liquid via the second support surface 26c, the first support surface 26b does not get wet. Thereafter, the first chuck 36a retreats into the first tank 32, and the second transport unit 20 transports the substrate W (preceding substrate W1) to the drying module 16. When the chuck 26 of the second transport unit 20 exits the chemical module 14, the chemical module 14 returns to the state illustrated in FIG. 12C. Thereafter, by repeatedly executing the operations illustrated in FIGS. 12C to 12J, the plurality of substrates W are continuously processed by the substrate processing device 10.

According to the present first embodiment as described above, it is possible to suppress an increase in size of the substrate processing device due to an increase in the number of processing tanks. Specifically, the first tank and the second tank are lined up in the direction (X-axis direction (first direction)) intersecting the transport direction (Y-axis direction (second direction)) of the substrate W of the second transport unit. Therefore, even when the number of processing tanks increases, an increase in the size of the substrate processing device in the main transport direction is suppressed.

Furthermore, in the second transport unit, the chuck that holds the substrate, moves in the second direction, and passes above the first tank is supported by the moving body of the actuator disposed above the first tank, so that a distance between the chuck and the moving body is short (for example, as compared with the case where the moving body moves on an opposite side of the first tank across the second tank as viewed from above). Therefore, it is not necessary to connect the chuck and the moving body via a horizontally long arm which is easily bent and easily vibrated. Furthermore, as a result, the size of the substrate processing device in the first direction is reduced, and the substrate processing device is downsized.

Second Embodiment

The present second embodiment is an improvement of the first embodiment described above. Therefore, the present second embodiment will be described focusing on differences from the first embodiment. Note that constituent elements substantially the same as the constituent elements of the first embodiment described above are denoted by the same reference signs.

Figure 13:
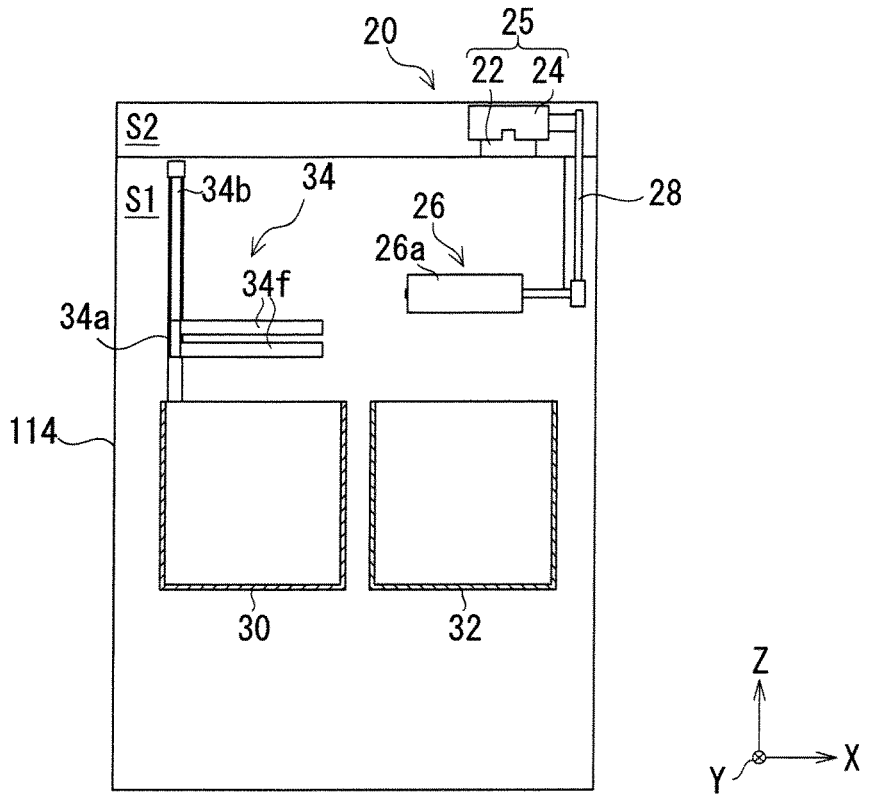
FIG. 13 is a side view of a chemical module in a substrate processing device according to a second embodiment.

FIG. 13 is a side view of a chemical module in a substrate processing device according to the second embodiment.

As illustrated in FIG. 13, unlike the chemical module 14 of the substrate processing device 10 according to the first embodiment described above, a chemical module 114 in a substrate processing device according to the present second embodiment does not include the first transport unit 36. Therefore, a first transport unit 34 immerses the substrate W in a first tank 32. That is, the first transport unit 34 receives the substrate W from a chuck 26 of a second transport unit 20 and immerses the received substrate W in a second tank 30. Next, the first transport unit 34 transports the substrate W from the inside of the second tank 30 into the first tank 32. Thereafter, the first transport unit 34 transfers the substrate W, which has been treated in the first tank 32, to the chuck 26 of the second transport unit 20.

In the case of the present second embodiment, as illustrated in FIG. 13, since the first transport unit 36 does not exist in front of the first tank 32, the size of the chemical module 114 in the X-axis direction (first direction) can be made smaller than that of the chemical module 14 of the first embodiment described above.

According to the present second embodiment as described above, similarly to the first embodiment described above, it is possible to suppress an increase in size of the substrate processing device due to an increase in the number of processing tanks.

Third Embodiment

The present third embodiment is different from the first embodiment in that a chuck of a second transport unit is different. Therefore, the present third embodiment will be described focusing on differences from the first embodiment. Note that constituent elements substantially the same as the constituent elements of the first embodiment described above are denoted by the same reference signs.

Figure 14:
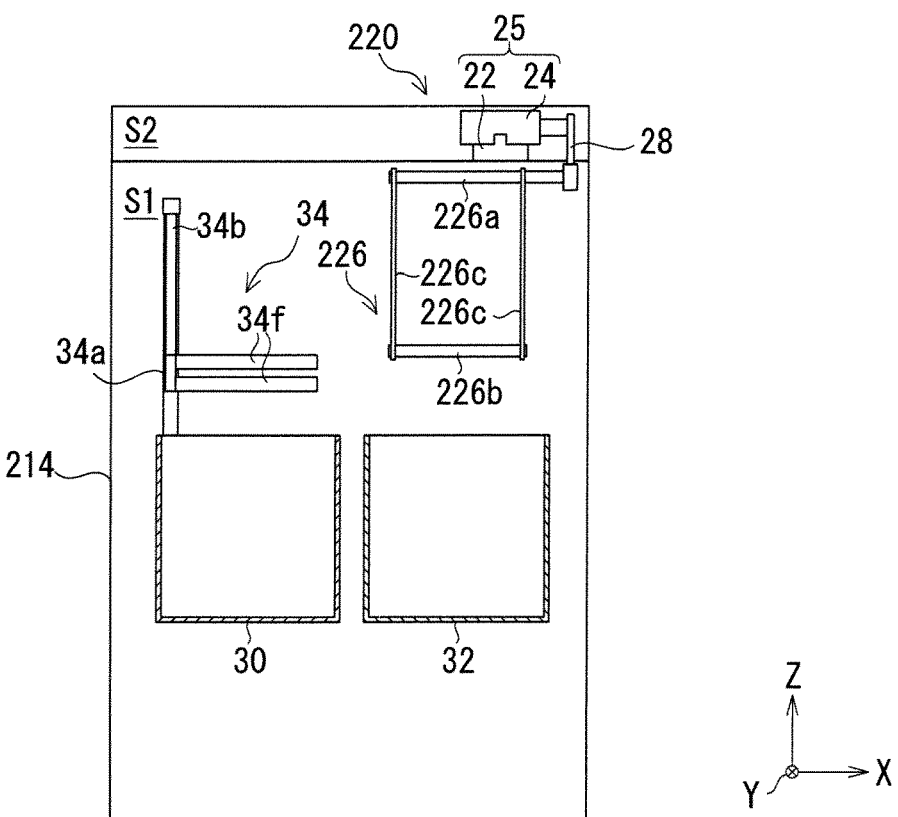
FIG. 14 is a side view of a chemical module in a substrate processing device according to a third embodiment.
Figure 15:
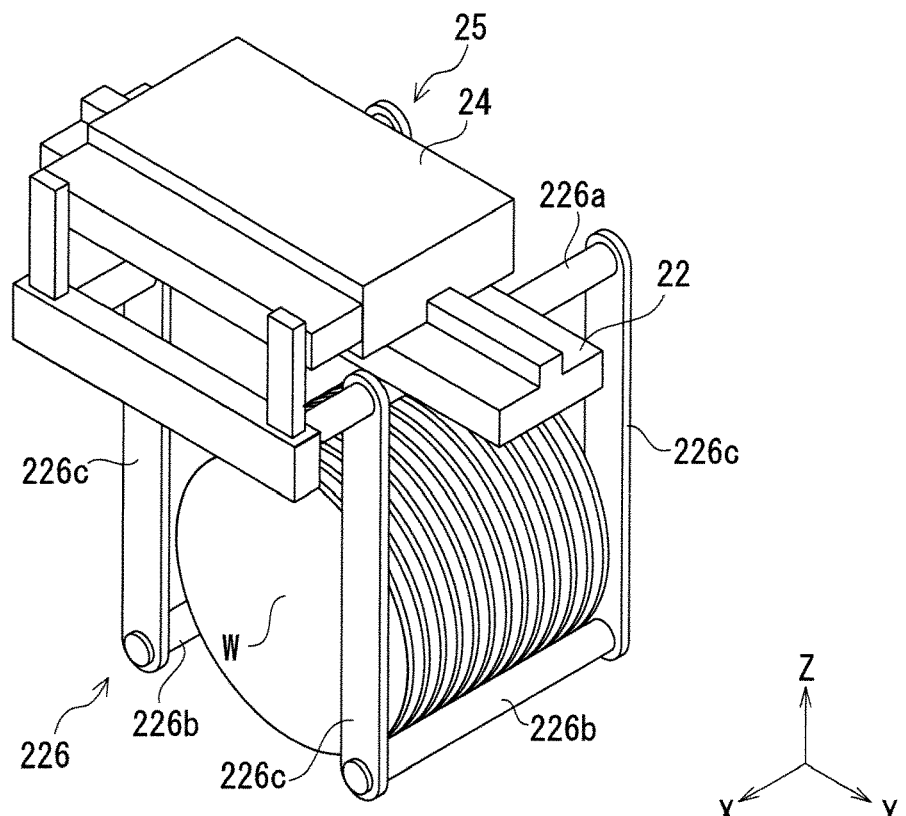
FIG. 15 is a perspective view of a second transport unit holding a substrate in the substrate processing device according to the third embodiment.

FIG. 14 is a side view of a chemical module in a substrate processing device according to the third embodiment. FIG. 15 is a perspective view of a second transport unit holding a substrate in the substrate processing device according to the third embodiment. Furthermore, FIG. 16 is a perspective view illustrating a chuck in the second transport unit.

Figure 16:
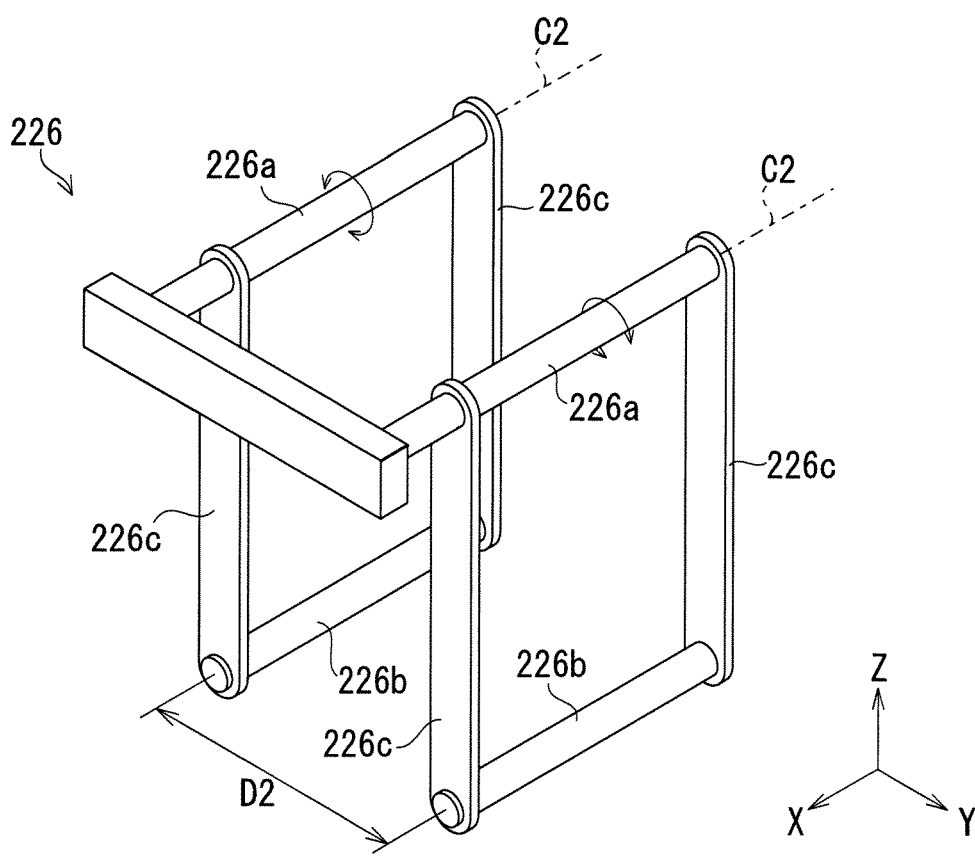
FIG. 16 is a perspective view illustrating a chuck in the second transport unit of the substrate processing device according to the third embodiment.

As illustrated in FIGS. 14 to 16, a chuck 226 of a second transport unit 220 includes two rotation shafts 226a extending rearward in the X-axis direction (first direction) of a substrate processing device (chemical module 214) and extending in parallel with each other, two support bars 226b extending in the X-axis direction and on which a plurality of substrates W is placed, and a plurality of links 226c connecting the rotation shafts 226a and the support bars 226b. Specifically, each of the support bars 226b is suspended and supported by the corresponding rotation shaft 226a via two links 226c. Furthermore, each of the rotation shafts 226a is rotated about a rotation center line C2 extending in the Y-axis direction (second direction) by a motor (not illustrated) such that a distance D2 between the two support bars 226b can be changed. By changing the distance D2, the chuck 226 can hold the substrate W or release the substrate W. Note that the support bar 226b is formed with a plurality of grooves (not illustrated) that engage with the outer circumferential ends of the plurality of substrates W to maintain the plurality of substrates W at predetermined intervals.

According to the present third embodiment described above, similarly to the first embodiment described above, it is possible to suppress an increase in size of the substrate processing device due to an increase in the number of processing tanks.

Note that the second transport unit 220 according to the present third embodiment can replace the second transport unit 20 of the chemical module 114 according to the second embodiment described above.

Furthermore, the first transport unit can be changed corresponding to the second transport unit 220 according to the present third embodiment.

Figure 17:
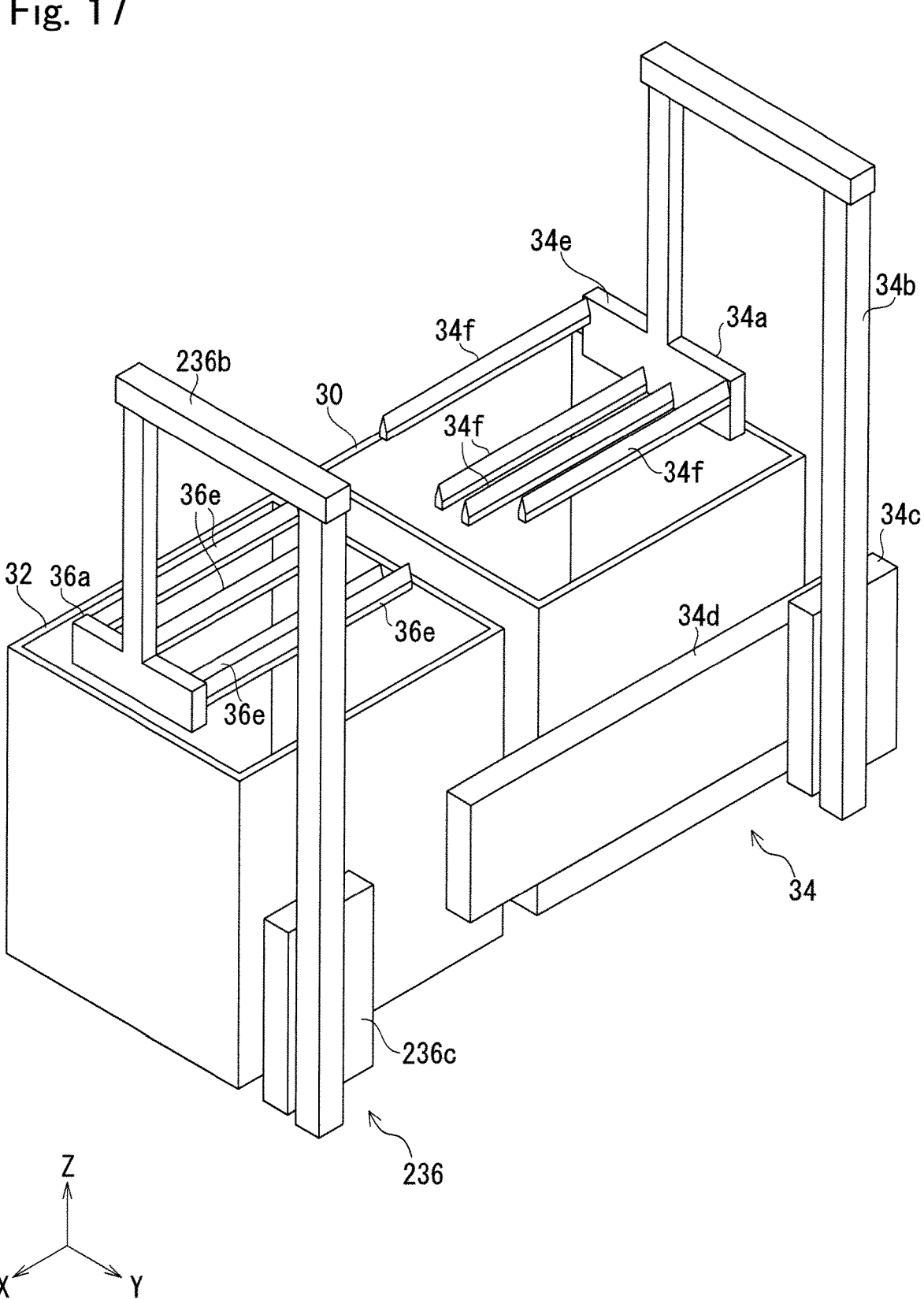
FIG. 17 is a perspective view illustrating a plurality of first transport units according to a modification of the third embodiment.

FIG. 17 is a perspective view illustrating a plurality of first transport units according to a modification of the third embodiment.

As illustrated in FIG. 17, a first transport unit 236 according to the modification of the present third embodiment is different from the first transport unit 36 according to the first embodiment described above.

Specifically, a first chuck 36a of the first transport unit 236 according to the modification of the present third embodiment is substantially the same as the first chuck 36a of the above-described first embodiment. On the other hand, an arm 236b that supports the first chuck 36a of the first transport unit 236 and an actuator 236c that raises and lowers the arm 236b are different in position. In the modification of the present third embodiment, the arm 236b and the actuator 236c are not disposed in front of a first tank 32, but are disposed on one side in the Y-axis direction (second direction) of the substrate processing device with respect to the first tank 32, similarly to an arm 34b and an actuator 34c of a first transport unit 34. As a result, the size of the substrate processing device in the X-axis direction (first direction) is reduced, and the substrate processing device can be downsized.

Fourth Embodiment

The present fourth embodiment is different from the first embodiment in that the number of first transport units is one and the chuck of the second transport unit is different. Therefore, the present fourth embodiment will be described focusing on differences from the first embodiment. Note that constituent elements substantially the same as the constituent elements of the first embodiment described above are denoted by the same reference signs.

Figure 18:
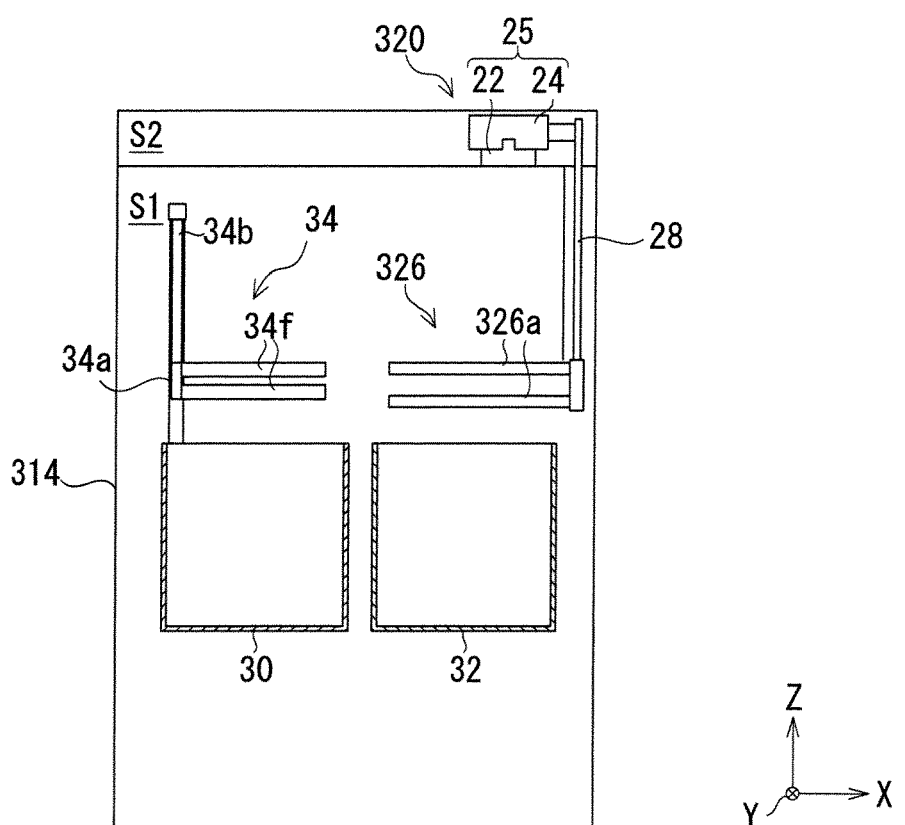
FIG. 18 is a side view of a chemical module in a substrate processing device according to a fourth embodiment.
Figure 19:
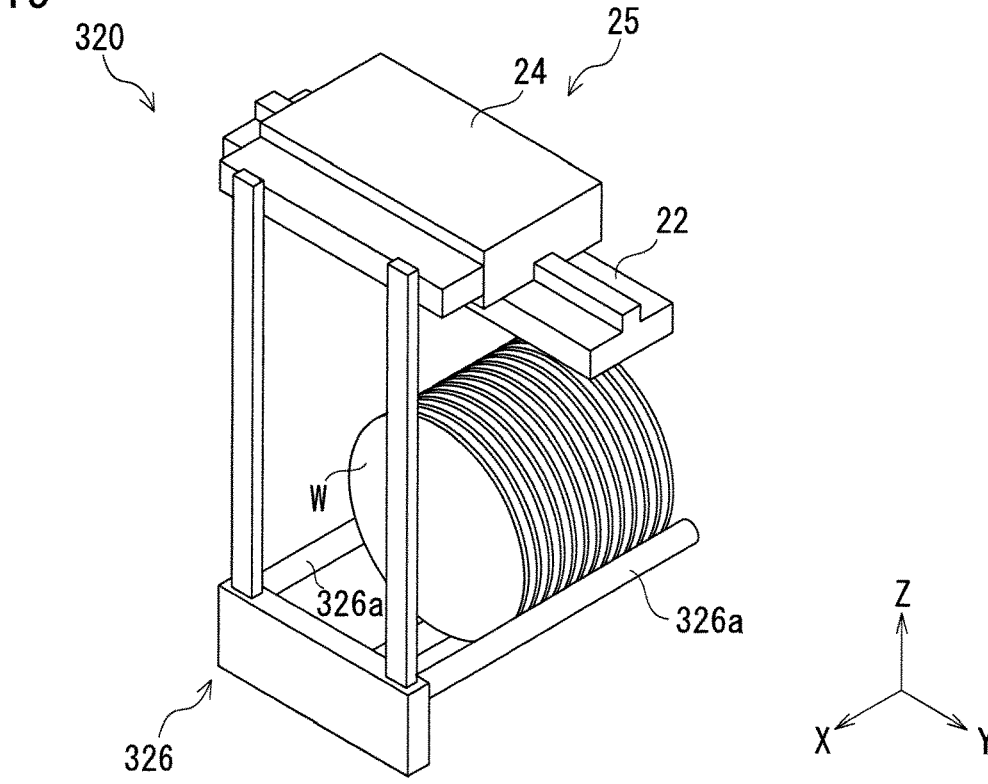
FIG. 19 is a perspective view of a second transport unit holding a substrate in the substrate processing device according to the fourth embodiment.

FIG. 18 is a side view of a chemical module in a substrate processing device according to the fourth embodiment. FIG. 19 is a perspective view of a second transport unit holding a substrate in the substrate processing device according to the fourth embodiment. Furthermore, FIG. 20 is a perspective view illustrating a chuck in the second transport unit.

Figure 20:
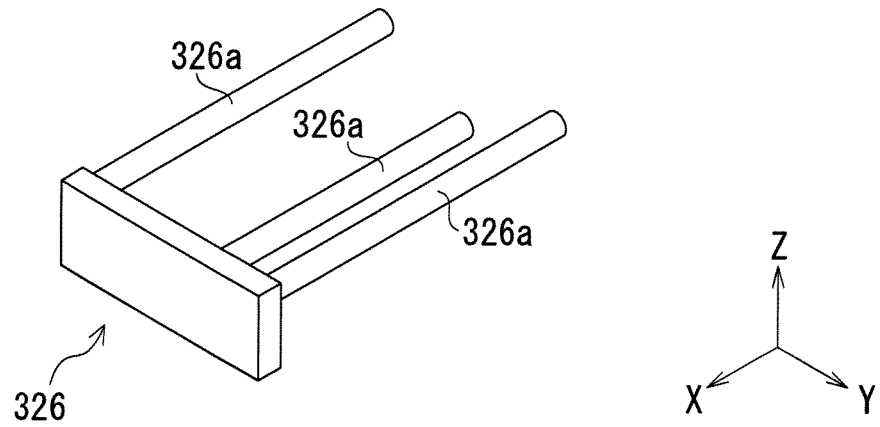
FIG. 20 is a perspective view illustrating a chuck in the second transport unit of the substrate processing device according to the fourth embodiment.

As illustrated in FIGS. 18 to 20, a chuck 326 of a second transport unit 320 includes a plurality of support rods 326a that extend rearward in the X-axis direction (first direction) of a substrate processing device (chemical module 314) and extend in parallel with each other, and on which a plurality of substrates W is placed. Note that the support rod 326a is formed with a plurality of grooves (not illustrated) that engage with the outer circumferential ends of the plurality of substrates W to maintain the plurality of substrates W at predetermined intervals.

In aa case where such a chuck 326 is used, the first transport unit 36 of the above-described first embodiment cannot be used. Since the chuck 326 and the first transport unit 36 interfere with each other, the substrate W cannot be transferred from the first transport unit 36 to the chuck 326. Therefore, in the case of the present fourth embodiment, the first transport unit 34 transfers the substrate W to the chuck 326, similarly to the above-described second embodiment.

According to the present fourth embodiment described above, similarly to the first embodiment described above, it is possible to suppress an increase in size of the substrate processing device due to an increase in the number of processing tanks.

Fifth Embodiment

In the case of the above-described first embodiment, as illustrated in FIGS. 4A to 4C, the actuator 25 of the second transport unit 20 is disposed above the first tank 32. In the present fifth embodiment, an actuator of a second transport unit is disposed at a different position. Therefore, the present fifth embodiment will be described focusing on differences from the first embodiment. Note that constituent elements substantially the same as the constituent elements of the first embodiment described above are denoted by the same reference signs.

Figure 21:
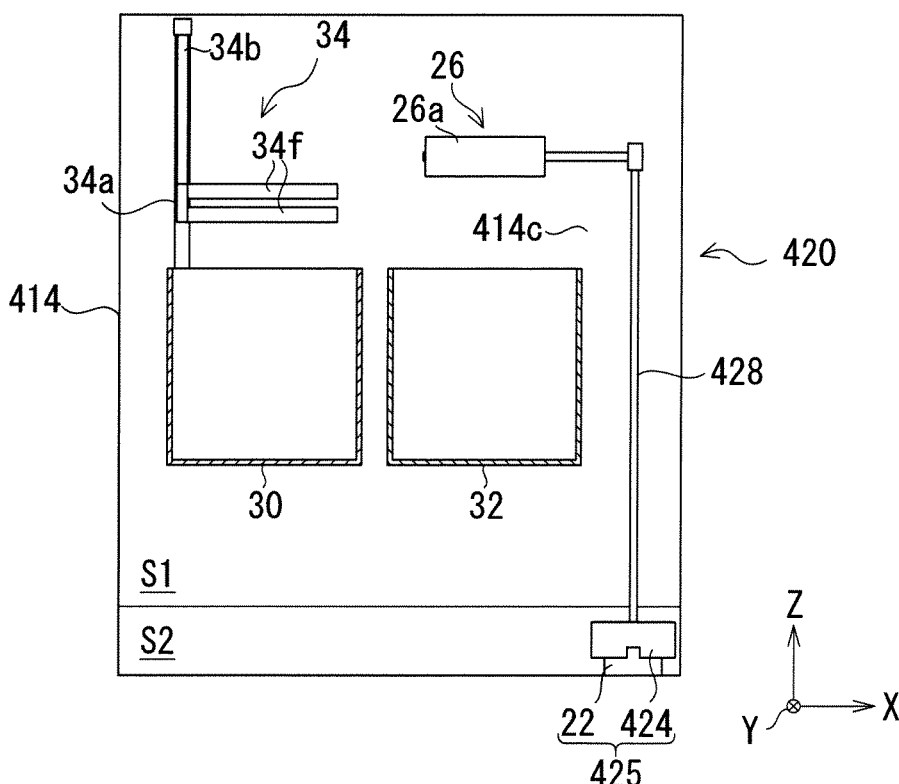
FIG. 21 is a side view of a chemical module in a substrate processing device according to a fifth embodiment.

FIG. 21 is a side view of a chemical module in a substrate processing device according to the fifth embodiment.

As illustrated in FIG. 21, in a substrate processing device according to the fifth embodiment, an actuator 425 of a second transport unit 420 is disposed on a side of a first tank 32 in the X-axis direction (first direction) in a chemical module 414. Furthermore, the actuator 425 is disposed below the first tank 32. A moving head 424 of the actuator 425 and a chuck 26 are connected by an arm 428 extending in the Z-axis direction (third direction). Furthermore, the actuator 425 is isolated from a treatment space S1 in which the first tank 32 and a second tank 34 are disposed, and is disposed in a drive space S2 provided below the treatment space S1.

In the case of present fifth embodiment, as compared with the first embodiment described above in which the moving head 24 of the actuator 25 of the second transport unit 20 moves above the first tank 32, the size of the substrate processing device (chemical module 414) in the Z-axis direction (height direction) can be reduced.

According to the present fifth embodiment described above, similarly to the first embodiment described above, it is possible to suppress an increase in size of the substrate processing device due to an increase in the number of processing tanks.

The embodiments of the present disclosure have been described above with reference to the plurality of embodiments. However, the embodiments of the present disclosure are not limited thereto.

For example, in the case of the above-described first embodiment, the second tank 30 located on the rear side of the substrate processing device 10 is a chemical liquid tank, and the first tank 32 located on the front side of the substrate processing device 10 is a cleaning tank. However, the embodiment of the present disclosure is not limited thereto. For example, the second tank 30 may be used as a cleaning tank, and the first tank 32 may be used as a chemical liquid tank. In this case, since the second chuck 34a and the first chuck 36a of the first embodiment described above are configured to be able to transfer the substrates W to and from each other, the plurality of substrates W is transferred from the first chuck 36a of the first transport unit 36 to the second chuck 34a of the first transport unit 34.

That is, in a broad sense, a substrate processing module according to an embodiment of the present disclosure is a substrate processing module that processes a substrate, the substrate processing module including: a first tank and a second tank that are arranged in a first direction and in which a substrate can be disposed; a first transport unit that transports the substrate to the first tank and the second tank; and a second transport unit that transports the substrate in a second direction intersecting the first direction and transfers the substrate to and from the first transport unit, in which the second transport unit includes a chuck that holds the substrate and passes above the first tank, and an actuator that moves the chuck in the second direction, and the actuator of the second transport unit is disposed on a side of the first tank in the first direction in the substrate processing module.

Furthermore, a substrate processing device according to another embodiment of the present disclosure is a substrate processing device including the substrate processing module and another module connected to the substrate processing module in the second direction.

As described above, the above-described embodiments have been described as examples of the technique in the present disclosure. To that end, the drawings and detailed description are provided. Therefore, the constituent elements described in the drawings and the detailed description may include not only constituent elements essential for solving the problem but also constituent elements that are not essential for solving the problem in order to illustrate the above-described technique. Therefore, it should not be immediately recognized that these non-essential constituent elements are essential based on the fact that these non-essential constituent elements are described in the drawings and the detailed description.

Furthermore, since the above-described embodiments are intended to illustrate the technique in the present disclosure, various changes, replacements, additions, omissions, and the like can be made within the scope of the claims or equivalents thereof.

INDUSTRIAL APPLICABILITY

The present disclosure is applicable to a substrate processing device that processes a substrate using a plurality of tanks.

EXPLANATION OF REFERENCES

10 substrate processing device
14 substrate processing module (chemical module)

20 second transport unit
25 actuator
26 chuck
30 second tank
32 first tank
34 first transport unit
36 first transport unit
W substrate

The invention claimed is:

1. A substrate processing module that processes a substrate, the substrate processing module comprising:

a first tank and a second tank that are arranged in a first direction that is a front-back direction of the substrate processing module, and in which a substrate can be disposed;

a first transport unit that transports the substrate to the first tank and the second tank; and a second transport unit that transports the substrate in a second direction intersecting the first direction and transfers the substrate to and from the first transport unit, wherein the first tank is located on a front side of the substrate processing module, the second tank is located on a back side of the substrate processing module, the second transport unit includes a chuck that holds the substrate and passes above the first tank, and an actuator that moves the chuck in the second direction, the actuator includes a moving head moving in the second direction and supporting the chuck, the actuator of the second transport unit is disposed on a side of the first tank in the first direction in the substrate processing module, and the moving head moves in the second direction with at least a portion of the moving head overlapped with the first tank as viewed in a third direction intersecting both the first and second directions.

2. The substrate processing module according to claim 1, wherein the actuator of the second transport unit is disposed above or below the first tank.

3. The substrate processing module according to claim 2, wherein the actuator of the second transport unit is disposed above the first tank.

4. The substrate processing module according to claim 1, wherein the actuator of the second transport unit is disposed in a drive space isolated from a treatment space in which the first tank and the second tank are disposed.

5. The substrate processing module according to claim 4, wherein a top plate portion is provided above the treatment space, and the drive space is located above the top plate portion.

6. The substrate processing module according to claim 1, wherein the second transport unit includes an arm extending in a height direction so as to connect the actuator and the chuck, and the arm is located in front of the first tank.

7. The substrate processing module according to claim 6, further comprising a hanging plate that partitions an upper space of the first tank and the arm.

8. The substrate processing module according to claim 1, wherein the first transport unit includes two first transport units, one of the first transport units includes a first chuck movable into the first tank in a state of holding the substrate, another of the first transport units includes a second chuck movable into the second tank and movable above the first tank in a state of holding the substrate, and the first chuck and the second chuck are configured to be able to transfer the substrate between the first chuck and the second chuck.

9. The substrate processing module according to claim 1, wherein the first tank is a cleaning tank, and the second tank is a chemical liquid tank.

10. A substrate processing device comprising: the substrate processing module according to claim 1; and another module connected to the substrate processing module in the second direction.

11. The substrate processing module according to claim 1, wherein the moving head transports the substrate by the chuck from outside the substrate processing module into the substrate processing module or vice versa.

* * * * *